US012174815B2

(12) United States Patent
Stephens et al.

(10) Patent No.: US 12,174,815 B2
(45) Date of Patent: Dec. 24, 2024

(54) PARTITIONING, PROCESSING, AND PROTECTING COMPRESSED DATA

(71) Applicant: AirMettle, Inc., Houston, TX (US)

(72) Inventors: Donpaul C. Stephens, Houston, TX (US); Joshua R. Fuhs, Columbus, IN (US)

(73) Assignee: AirMettle, Inc., Houston, TX (US)

(*) Notice: Subject to any disclaimer, the term of this patent is extended or adjusted under 35 U.S.C. 154(b) by 0 days.

(21) Appl. No.: 17/978,609

(22) Filed: Nov. 1, 2022

(65) Prior Publication Data
US 2023/0153287 A1 May 18, 2023

Related U.S. Application Data

(60) Provisional application No. 63/278,900, filed on Nov. 12, 2021.

(51) Int. Cl.
*G06F 16/00* (2019.01)
*G06F 16/174* (2019.01)
*G06F 16/22* (2019.01)
*G06F 16/27* (2019.01)

(52) U.S. Cl.
CPC ...... *G06F 16/2282* (2019.01); *G06F 16/1744* (2019.01); *G06F 16/278* (2019.01)

(58) Field of Classification Search
None
See application file for complete search history.

(56) References Cited

U.S. PATENT DOCUMENTS

| 9,426,219 | B1 | 8/2016 | Keyser |
| 9,507,843 | B1 | 11/2016 | Madhavarapu et al. |
| 9,965,539 | B2 | 5/2018 | D'Halluin et al. |
| 10,983,973 | B2 | 4/2021 | Kunnatur et al. |
| 11,030,171 | B2 | 6/2021 | Shahane et al. |
| 2005/0102561 | A1* | 5/2005 | Graham ............... H04L 67/06 714/15 |
| 2005/0244005 | A1 | 11/2005 | Grigorovitch et al. |
| 2012/0079364 | A1 | 3/2012 | Agarwal et al. |
| 2012/0089562 | A1 | 4/2012 | Deremigio et al. |
| 2016/0189666 | A1* | 6/2016 | Morein ............... G09G 5/18 345/555 |
| 2020/0125751 | A1 | 4/2020 | Hariharasubrahmanian et al. |
| 2021/0034586 | A1 | 2/2021 | Arye et al. |

(Continued)

FOREIGN PATENT DOCUMENTS

| WO | 2014139463 | 9/2014 | |
| WO | WO-2020222727 A1 * | 11/2020 | ......... G06F 16/1744 |
| WO | 2021096822 | 5/2021 | |

OTHER PUBLICATIONS

International Search Report and Written Opinion for application No. PCT/US2022/048590, dated Feb. 27, 2023, 10 pages.

(Continued)

*Primary Examiner* — Bai D Vu
(74) *Attorney, Agent, or Firm* — BainwoodHuang

(57) ABSTRACT

A technique of partitioning compressed data includes splitting the compressed data into multiple portions. The technique further includes storing a decompression state in association with a current portion, wherein the decompression state is based on data of a previous portion and enables decompression of the current portion independently of other portions.

22 Claims, 19 Drawing Sheets

(56) References Cited

U.S. PATENT DOCUMENTS

2021/0144226 A1* 5/2021 De Icaza Amozurrutia ............... H03M 7/6052
2022/0405142 A1* 12/2022 Ouyang ................. G06F 9/544

OTHER PUBLICATIONS

Armbrust, M., Das, T., Sun, L., Yavuz, B., Zhu, S., Murthy, M., Torres, J., Van Hovell, H., Ionescu, A., Luszczak, A., et al. Delta lake: high-performance acid table storage over cloud object stores. Proceedings of the VLDB Endowment 13, 12 (2020), 3411-3424.

Armbrust, M., Ghodsi, A., Xin, R., and Zaharia, M. Lakehouse: A new generation of open platforms that unify data warehousing and advanced analytics. CIDR.

Barbalace, Antonio and Do, Jaeyoung, Computational Storage: Where Are We Today?, CIDR, 2021,http://cidrdb.org/cidr2021/papers/cidr2021_paper29.pdf.

Dageville, B., Cruanes, T., Zukowski, M., Antonov, V., Avanes, A., Bock, J., Claybaugh, J., Engovatov, D., Hentschel, M., Huang, J., et al. The Snowflake Elastic Data Warehouse. In SIGMOD (2016).

Zlib 1.2.11 Manual, retrieved from the Wayback Machine—https://web.archive.org/web/20211004232059/http://zlib.net/manual.html, 26 pages.

Zeng, Zhiyu, et al., "Parallel Partitioning Based On-Chip Power Distribution Network Analysis Using Locality Acceleration", downloaded on Sep. 10, 2022 from IEEE Xplore, 6 pages.

Do, J., Kee, Y.-S., Patel, J. M., Park, C., Park, K., and Dewitt, D. J. Query Processing on Smart SSDs: Opportunities and Challenges. In SIGMOD (2013).

Hunt, R. S3 Select and Glacier Select—Retrieving Subsets of Objects. https://aws.amazon.com/blogs/aws/s3-glacier-select, 2018.

Langdale, Geoff and Lemire, Daniel, Parsing gigabytes of JSON per second, The VLDB Journal, vol. 28, No. 6, p. 941-960, 2019? https://core.ac.uk/download/pdf/227192468.pdf.

Mahmud Mohammad Sultan et al: "A Survey of Data Partitioning and Sampling Methods to Support Big DataAnalytics", Big Data Mining and Analytics, vol. 3, No. 2, Feb. 27, 2020(Feb. 27, 2020), pp. 85-101, XP 055827053, DOI: 10.26599/BDMA.2019.9020015 Retrieved from the Internet: URL:https://ieeexplore.ieee.org/stamp/stamp.jsp?tp=&arnumber=9007871.

Notification of Transmittal of the International Search Report and the Written Opinion of the International Searching Authority, or the Declaration, PCT/US2021/031965, International Filing Date: May 12, 2021, 16 pages.

Bge, Chang and Li, Yinan and Eilebrecht, Eric and Chandramouli, Badrish and Kossmann, Donald, Speculative distributed CSV data parsing for big data analytics, Proceedings of the 2019 International Conference on Management of Data, 883-899, 2019, https://badrish.net/papers/dp-sigmod19.pdf.

Tan, J., Ghanem, T., Perron, M., Yu, X., Stonebraker, M., Dew Itt, D., Serafini, M., Aboul-Naga, A., and Kraska, T. Choosing a cloud dbms: architectures and tradeoffs. Proceedings of the VLDB Endowment 12, 12 (2019), 2170-2182.

Weiss, R. A Technical Overview of the Oracle Exadata Database Machine and Exadata Storage Server. Oracle White Paper. Oracle Corporation, Redwood Shores (2012).

Yu, X., Youill, M., Woicik, M., Ghanem, A., Serafini, M., Aboulnaga, A., and Stone-Braker, M. Pushdowndb: Accelerating a dbms using s3 computation. In 2020 IEEE 36th International Conference on Data Engineering (ICDE) (2020), IEEE, pp. 1802-1805.

Feldspar, Antaeus, "An Explanation of the Deflate Algorithm", originally posted to comp.compression on Aug. 23, 1997, 5 pages, zlib.net/feldspar.html.

Gzip—GNU Project—Free Software Foundation, retrieved from the Wayback Machine—https://web.archive.org/web/20211019151638/https://www.gnu.org/software/gzip, 2 pages.

\* cited by examiner

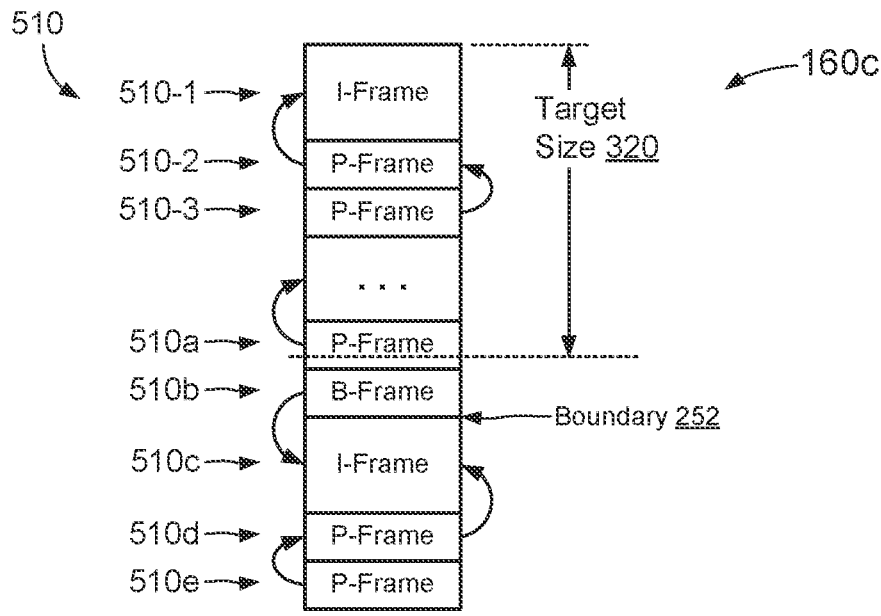
FIG. 5A
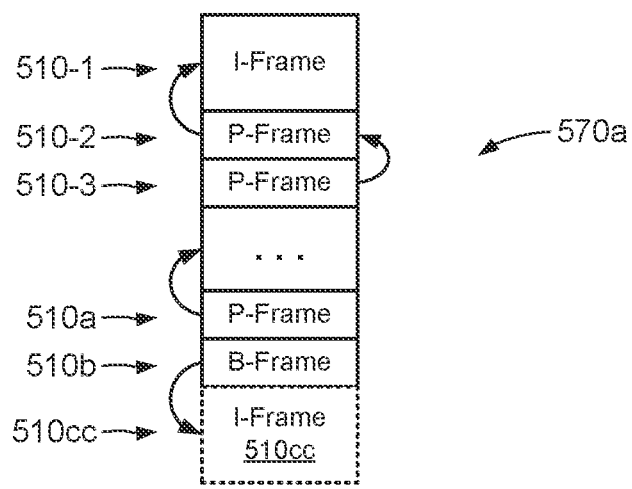
FIG. 5B
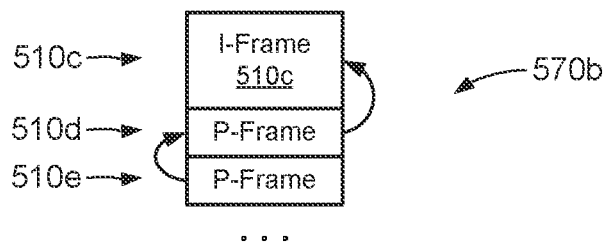

PARTITIONING, PROCESSING, AND PROTECTING COMPRESSED DATA

CROSS-REFERENCE TO RELATED APPLICATIONS

This invention claims the benefit of U.S. Provisional Application No. 63/278,900, filed on Nov. 12, 2021, the contents and teachings of which are incorporated herein by reference in their entirety.

STATEMENT REGARDING FEDERALLY SPONSORED RESEARCH OR DEVELOPMENT

This invention was made with government support under 2135007 awarded by the National Science Foundation. The government has certain rights in the invention.

BACKGROUND

Data processing and protection have undergone transformational change with the increased availability of inexpensive processors and storage media. Users now have the option to process and store their data locally, or to store their data on servers connected over a network, in computing clusters, or in the cloud. In addition, cloud computing options include both public cloud and private cloud offerings.

With the era of big data upon us, users wish to store and process ever more voluminous data objects. For example, it is not uncommon for tabular data, tree-based data, and audio and/or video data to reach sizes in the gigabyte range or above. Processing, protecting, and storing such large data objects presents unique challenges.

A common approach is to divide a large object into separate portions and to store the portions on respective computers. Programs may divide an object by identifying byte boundaries in the object and producing portions of equal size, or nearly so. To perform data processing on a data object once it has been stored in a distributed manner, a computer may gather particular portions or groups of portions of the original object, perform desired processing tasks on the gathered portions, and generate results.

SUMMARY

Unfortunately, the above-described distributed approach can be inefficient. For example, the practice of dividing large data objects into equal or nearly equal portions can ignore structural features and can introduce dependencies between or among different data portions. As a simple example, consider a data object containing many rows of tabular data. Dividing the object to form equal-sized portions may mean cutting off a row in the middle. Any subsequent query that involves access to the cut-off row may thus require access to two portions of the data object, one that stores the beginning of the row and one that stores the end. The two portions may typically be stored on different computers on a network.

Continuing with the above example, it may further be necessary to transfer both portions (containing both parts of the cut-off row) back to the requester or to some other node, where the portions are reassembled and a query is performed. These acts introduce large inefficiencies as they involve large copies of data over the network.

In addition to the above, the prior approach may be oblivious to content. For example, a split-off portion of a data object may lose its association with the data object as a whole. Field names may be missing for tabular data (e.g., if only row data are stored). Extracting meaningful data from a distributed object may thus involve directing many network accesses to different computers, in an effort to collect all the pieces needed to complete a desired processing task. What is needed is a more efficient way of handling large data objects.

To address this need at least in part, a technique for managing data objects in a storage cluster includes splitting a data object into multiple portions at boundaries within the data object. The technique further includes transforming the portions of the data object into segments that provide individually processable units, and distributing the segments among multiple computing nodes of the storage cluster for storage therein Advantageously, providing segments as individually-processable units means that the workload associated with performing a processing task on the data object can be pushed down efficiently to the computing nodes that store the segments of the data object locally. The technique thus enables true parallel processing, with each computing node performing the processing task on only the segment or segments of the data object stored therein. It also greatly reduces network traffic as compared with prior schemes. For example, high-speed connections of computing nodes to their local storage greatly enhances overall efficiency. Further, the independent nature of segments means that little or no communication is required among computing nodes (e.g., to resolve dependencies) in order to complete a processing task.

In addition to the above, particular challenges arise when partitioning, transforming, and distributing data that are compressed. Although compressed data can be partitioned easily into portions, the resulting portions cannot generally be decompressed without reference to the data of previous portions. For example, a typical decompression algorithm requires references back to prior decompressed data, which provides a dictionary for continuing decompression. But such prior decompressed data is specifically missing if compressed data are merely split and distributed. What is needed, therefore, is a way of partitioning compressed data that preserves the ability to decompress individual portions without requiring access to previous portions, or to any other portions.

To address this need at least in part, an improved technique of partitioning compressed data includes splitting the compressed data into multiple portions. The technique further includes storing a decompression state in association with a current portion, wherein the decompression state is based on data of a previous portion and enables decompression of the current portion independently of other portions.

Advantageously, the improved technique enables portions of compressed data to be decompressed independently of other portions, thus greatly enhancing efficiency when portions are stored in a distributed manner, such as on different nodes of a storage cluster.

Certain embodiments are directed to a method of managing compressed data. The method includes splitting the compressed data into multiple portions of compressed data, the portions including (i) a current portion of the compressed data and (ii) a previous portion of the compressed data immediately prior to the current portion. The method further includes capturing a decompression state based on decompression of the previous portion, the decompression state enabling decompression of the current portion, and storing the current portion in association with the decompression state, such that the current portion is decompressible without reference to the previous portion.

In some examples, the decompression state stored in association with the current portion includes a dictionary formed from a range of decompressed data of the previous portion.

In some examples, the range of decompressed data has a length and extends to an end of the previous portion.

In some examples, the method further includes storing the portions of compressed data in respective segments on storage nodes of a storage cluster and tracking, in metadata, locations of the respective segments on the storage nodes.

In some examples, storing the portions of compressed data in the respective segments includes storing the current portion in a current segment on a particular node of the storage cluster, and storing the current portion in association with the decompression state includes storing the decompression state on the particular node.

In some examples, storing the decompression state on the particular node includes storing the decompression state in a header and/or a footer of the current segment.

In some examples, the metadata associates segments with respective byte ranges of compressed data stored in the respective segments, and the method further includes receiving a specified byte range of the compressed data, identifying, from the metadata, a target segment that stores at least a portion part of the specified identified byte range of the compressed data, and accessing the target segment to retrieve the specified byte range or the portion thereof.

In some examples, the metadata associates segments with respective byte ranges of uncompressed data, and the method further includes receiving a specified byte range of uncompressed data, identifying, from the metadata, a target segment that stores compressed data which, when decompressed, provides at least a portion part of the identified specified byte range of uncompressed data, and accessing the target segment to retrieve the specified byte range of uncompressed data or the portion thereof.

In some examples, the metadata associates segments with respective ranges of rows or records of uncompressed data, and the method further includes receiving a specified range of rows or records of the uncompressed data, identifying, from the metadata, a target segment that stores compressed data which, when decompressed, provides at least part of the specified identified range of rows or records, and accessing the target segment to retrieve the specified range of rows or records or the portion thereof.

In some examples, when splitting the compressed data into multiple portions, uncompressed versions of the portions of compressed data are closer to one another in size than are the portions of compressed data.

In some examples, splitting the compressed data includes identifying a target split location in the compressed data and splitting the compressed data at a selected split location different from the target split location based on uncompressed contents of the compressed data, the selected split location separating the current portion from a next portion that immediately follows the current portion.

In some examples, splitting the compressed data at the selected split location includes decompressing a range of compressed data in the current portion, identifying a boundary within the decompressed data of the range, the boundary defining an end of an individually processable unit of decompressed data, and assigning the selected split location as a location that follows the boundary.

In some examples, the individually processable unit of decompressed data includes any one of (i) a row of CSV (comma-separated values) data, (ii) an end of a JSON (JavaScript Object Notation) record, or (iii) any other row of row-delimited data or record of record-delimited data.

In some examples, the compressed data is arranged in deflate blocks, the boundary is contained within a particular deflate block of the compressed data, the particular deflate block having an end, and assigning the selected split location as the location that follows the boundary includes defining the selected split location as the end of the particular deflate block.

In some examples, the method further includes obtaining a set of fix-up data as data located between the boundary and the selected split location and storing the set of fix-up data in association with the next portion.

In some examples, the method further includes storing an indicator of the boundary in association with the current portion, the indicator identifying a location beyond which processing of uncompressed data derived from the compressed data of the current portion is ignored.

In some examples, the set of fix-up data is contained entirely within a dictionary to be stored in association with the next portion, and the method further includes storing, in association with the next portion, an indicator of the boundary within the dictionary.

In some examples, the set of fix-up data is not contained entirely within a dictionary to be stored in association with the next portion, and storing the set of fix-up data includes storing, in association with the next portion, additional fix-up data that is not contained within the dictionary.

In some examples, the method further includes identifying descriptive content in the decompressed data of a current portion and storing the descriptive content in association with the next portion to facilitate independent processing of data in the next portion.

Additional embodiments are directed to a computerized apparatus constructed and arranged to perform a method of managing compressed data, such as any of the methods described above. Still other embodiments are directed to a computer program product. The computer program product stores instructions which, when executed on control circuitry of a computerized apparatus, cause the computerized apparatus to perform a method of managing compressed data, such as any of the methods described above.

The foregoing summary is presented for illustrative purposes to assist the reader in readily grasping example features presented herein; however, this summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments, as illustrated in the accompanying drawings, in which like reference characters refer to the same or similar parts throughout the different views.

FIGS. 5A and 5B are block diagrams that show an example arrangement for splitting a data object that contains video data.

DETAILED DESCRIPTION

Embodiments of the improved technique will now be described. One should appreciate that such embodiments are provided by way of example to illustrate certain features and principles but are not intended to be limiting.

A technique for managing data objects in a storage cluster includes splitting a data object into multiple portions at boundaries within the data object. The technique further includes transforming the portions of the data object into segments that provide individually processable units, and distributing the segments among multiple computing nodes of the storage cluster for storage therein.

In the following description:

Section I presents an example environment as well as embodiments directed to partitioning, processing, and protecting data.

Section II presents example applications of the Section-I embodiments to compressed data.

Section I: Partitioning, Processing, and Protecting Data

This application discloses multiple embodiments. One embodiment is directed to splitting a data object into portions for distributed storage in the storage cluster. Another embodiment is directed to performing a distributed processing task by the storage cluster. Yet another embodiment is directed to protecting data of a data object stored in a storage cluster. These embodiments may be realized as respective aspects of a single system, as shown and described in the examples that follow. Alternatively, embodiments may be practiced independently, such that an implementation supporting any one of the embodiments need not also support the other embodiments.

Figure 1:
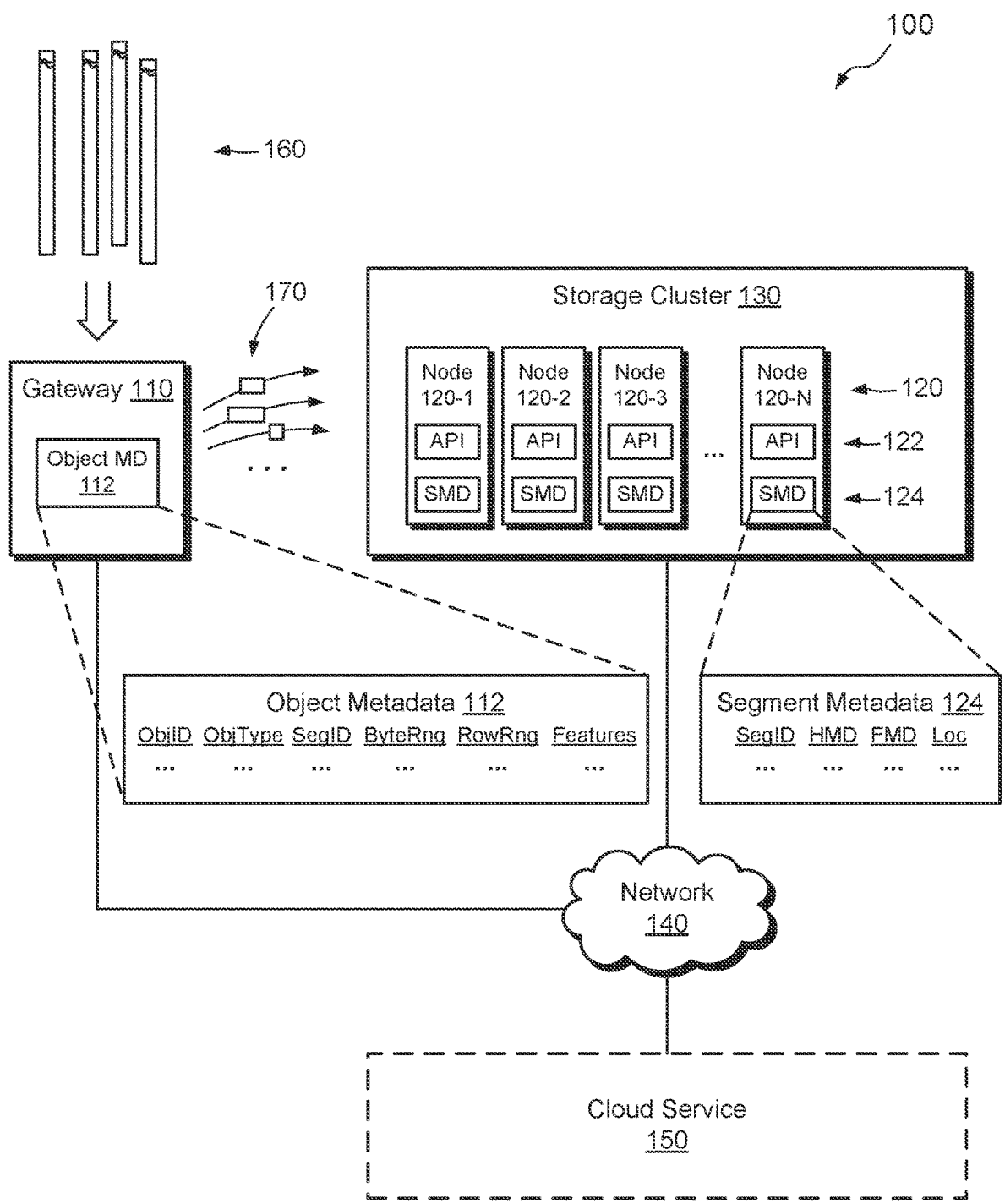
FIG. 1 is a block diagram of an example environment in which embodiments of the improved technique can be practiced.

FIG. 1 shows an example environment 100 in which embodiments of the improved technique can be practiced. As shown, a gateway 110 is configured to access multiple computing nodes 120 of a storage cluster 130 over a network 140 and to act as an interface between the storage cluster 130 and clients/users. The network 140 may include a local area network (LAN), a wide area network (WAN), the Internet, or any other type of network or combination of networks that supports digital communication between computers. The gateway 110 may be a computer or other computing device (e.g., server, workstation, tablet, smartphone, personal data assistant, gaming console, set-top box, or the like), which may include its own network interface, processor, and memory. In some examples, the gateway 110 may be provided as a computing node 120 of the storage cluster 130. Multiple computing nodes 120 (also referred to herein as "nodes") 120-1 through 120-N are shown, with the understanding that the storage cluster 130 may include a large number of nodes 120, such as hundreds or more. Each node 120 includes one or more processors and memory for running programs, as well as one or more network interfaces (e.g., network interface cards) and persistent storage, such as one or more solid-state drives (SSDs), magnetic disk drives, and/or the like. Nodes 120 of the storage cluster 130 may be interconnected via the network 140, or via a dedicated network (e.g., a separate local area network; not shown), or by other means. For purposes of this document, any network internal to the storage cluster 130 is considered herein to be part of the network 140.

Preferably, each node 120 has one or more high-speed connections to its respective persistent storage. For example, connections between nodes 120 and their storage devices (e.g., SSDs) may have bandwidths that exceed those of connections between nodes over network 140 by an order of magnitude or more.

In an example, the storage cluster 130 is configured as an object store, which may be compatible with commercially-available cloud-based object stores, such as AWS (Amazon Web Services) S3 (Simple Storage Service), Microsoft Azure Data Lake, and/or Google Cloud Storage. In a particular example, the storage cluster 130 is configured as an S3-compatible object store. To this end, each node 120 may include an API (application program interface) 122 that enables the node 120 to participate as a member of the object store.

The cluster 130 may be implemented in a data center, which may occupy a room or multiple rooms of a building, in which the nodes 120 are networked together. Other implementations may span multiple buildings, and metro-cluster arrangements are feasible.

In other examples, the storage cluster 130 may be implemented within a cloud service 150, e.g., using physical or virtual machines provided therein. For instance, the entire storage cluster 130 may be disposed entirely within the cloud service 150.

As yet another example, the cloud service 150 may act as a primary repository of data, with the storage cluster 130 acting as a cache for the cloud service 150. The storage cluster 130 may thus store commonly accessed data but typically not all data available from the cloud service 150.

Implementations may be suitable for individuals, small organizations, and/or enterprises, and may be delivered according to a SaaS (software as a service) model or according to other models. Embodiments are particularly suitable for managing large data objects, which may have sizes in the hundred-megabyte range or above. This feature makes embodiments a good match for big data applications, such as those involving data lakes. One should appreciate, though, that embodiments are not limited to any particular users, service model, data size, or application.

In example operation, gateway 110 (which may be part of the storage cluster 130 or separate therefrom) accesses one or more data objects 160 to be managed by the storage cluster 130. The data objects 160 may reside in the cloud service 150, e.g., within buckets or blobs, or they may be provided by one or more separate sources. For example, data objects 160 may be generated by real-time activities, such as industrial or scientific processes which may produce the data objects 160 as data logs or other records of ongoing activities. The data objects 160 may be presented as files, streams, memory ranges, or in any other manner.

The data objects 160 may be structured in accordance with particular object types. For example, data objects 160 may be provided as tabular objects such as CSV (comma-separated values) or log files, as tree-based objects such as JSON (JavaScript Object Notation) or XML (extensible markup language) documents, as column-oriented objects such as Apache Parquet files, as video files or streams, as audio files or streams, or as collections of pictures, for example. Although certain types of data are particularly shown and/or described, one should appreciate that embodiments are intended to encompass any type of data, with the ones shown and/or described merely providing concrete examples used to illustrate operating principles.

To initiate management of a data object 160, gateway 110 may scan the data object, e.g., starting from the beginning of the data object and proceeding forward. Normally, the gateway 110 may be oblivious to the data object's type when it first accesses the object and may perform an initial scan of the object 160 to identify its type. The scan may involve sampling a set of regions of the data object, typically at the beginning of the object, and searching for sequences or characters that are specific to particular object types. For instance, CSV and log files typically use NewLine characters to denote ends of records, and may use commas, spaces, or other characters to separate adjacent fields. Some data objects may include headers that directly identify the type of object. For example, Parquet files start with a 4-byte header that designates a so-called "magic number," which provides the code "PAR1" to identify the file as a Parquet file. Most file types provide clear indications that enable them to be identified without much effort. Some types may be harder to identify. Should one wish to recognize such less-easily identifiable types, more advanced algorithms may be applied, which may include machine learning or other types of artificial intelligence.

Once the gateway 110 has identified the type of the data object 160, the gateway 110 may proceed to start splitting the data object 160 into portions. For example, gateway 110 may search for boundaries in the data object that provide separators between adjacent processable units of the data object. The exact nature of the boundaries may vary from one object type to another. For example, CSV files may use NewLine characters to identify boundaries, whereas video files or streams may use I-frames (intra-coded pictures). Some object types specify boundaries using embedded metadata. For instance, Parquet files contain footers that identify boundaries between adjacent row groups.

The "processable units" of a data object are regions which are amenable to independent processing, in the sense that they contain few if any dependencies on other processable units. Splitting a data object into processable units thus promotes efficient parallel processing by nodes 120 of the storage cluster 130.

Although splitting is a first step in promoting independent processing of split-off portions, it is not always sufficient for optimal performance. For example, split-off portions may lack certain metadata (e.g., headers, footers, or other content) that cause them to retain dependencies on other parts of the data object 160. Thus, the gateway 110 preferably performs an additional step of transforming the split-off portions into segments 170. In an example, the transformed segments 170 can be processed as if they were complete, self-contained objects of the same type as the data object 160.

The segments 170 are similar to the portions from which they were created, but they are adjusted to reduce or eliminate dependencies on other portions. For example, if the first portion of a CSV file contains a header but subsequent portions do not, then the gateway 110 may copy the header of the first portion to each of the segments 170 that are formed from the subsequent portions. In this manner, each segment 170 has its own header and can be processed as if it were an independent CSV file. Corresponding adjustments may be performed for other object types, with the particulars of the adjustments depending on the object type. Various examples are provided below.

With the segments 170 thus formed as independently-processable units of the same type as the data object 160, gateway 110 may distribute the segments 170 to various nodes 120 of the storage cluster 130, which nodes 120 store the segments therein, e.g., in persistent storage locally connected to the respective nodes 120. To keep track of segment locations, gateway 110 may update object metadata 112.

As shown in an expanded view of FIG. 1, object metadata 112 includes object-specific information that facilitates operation of the storage cluster 130. Such object metadata 112 may include the following elements, for example:

ObjID. An object identifier, which is preferably unique within a namespace of the storage cluster 130.

ObjType. A determined type of the data object 160, such as CSV, JSON, XML, Parquet, etc.

SegID. An identifier of a segment 170 created from a portion of the object. Preferably unique within the namespace of the storage cluster 130.

ByteRng. A range of bytes of the data object 160 included in the current segment. May be expressed as a value-pair that specifies a start byte position and an end byte position (or as a start byte position and a length).

RowRng. A range of rows of the data object 160 included in the current segment. Relevant to tabular data and other types of data provided in rows.

Features. Features detected in segments that may be relevant to later processing. May be provided on a per-segment basis.

Although shown as a single-level structure, object metadata 112 may be arranged in any suitable manner, which may include a hierarchical structure. Also, the scope of object metadata 112 is not limited to the examples provided. Indeed, object metadata 112 may store any information that facilitates operation of the storage cluster 130 or processing tasks that may be performed therein.

In some examples, object metadata 112 is stored redundantly to promote reliability. For instance, object metadata 112 may be stored on multiple nodes 120 of the storage cluster 130, e.g., using a multi-way mirror and/or other RAID (Redundant Array of Independent Disks) or erasure-coding techniques. Also, activities attributed herein to the gateway 110 may be performed by any number of computers, and such computers may include nodes 120 of the storage cluster 130. For example, a particular node of the storage cluster 130 may be designated as a load balancer and may take the workload of nodes 120 into account when segments 170 are distributed among nodes of the cluster.

As still further shown in FIG. 1, computing nodes 120 may store segment metadata 124, which describes the segments 170 stored by the respective nodes 120. Examples of segment metadata 124 may include the following elements:

SegID. The unique identifier of a segment stored on the computing node 120.

HMD. Header metadata that forms part of the segment stored on the computing node 120. May be a copy of header metadata, originally found in another segment derived from the same object, which is included with the current segment to promote independent processing of the current segment.

FMD. Footer metadata that forms part of the segment stored on the computing node 120. May be a copy of footer metadata, originally found in another segment derived from the same object, which is included with the current segment to promote independent processing of the current segment.

Loc. A location at which the node 120 may access the current segment. Expressed in any suitable manner, such as by disk drive and logical block address (LBA), as a volume, as a file, as an aggregate, or in any other manner used by the node 120 in addressing its data.

As with object metadata 112, segment metadata 124 may also be stored redundantly to promote reliability. In some examples, nodes 120 may store segment metadata 124 along with the segments 170 that the metadata describe. For example, segment metadata for segment A may be stored with Segment A. Likewise, segment metadata for segment B may be stored with Segment B. Segment metadata 124 may then be protected in the same ways that the segments 170 themselves are protected. Various examples of segment protection are described hereinbelow.

Figure 2:
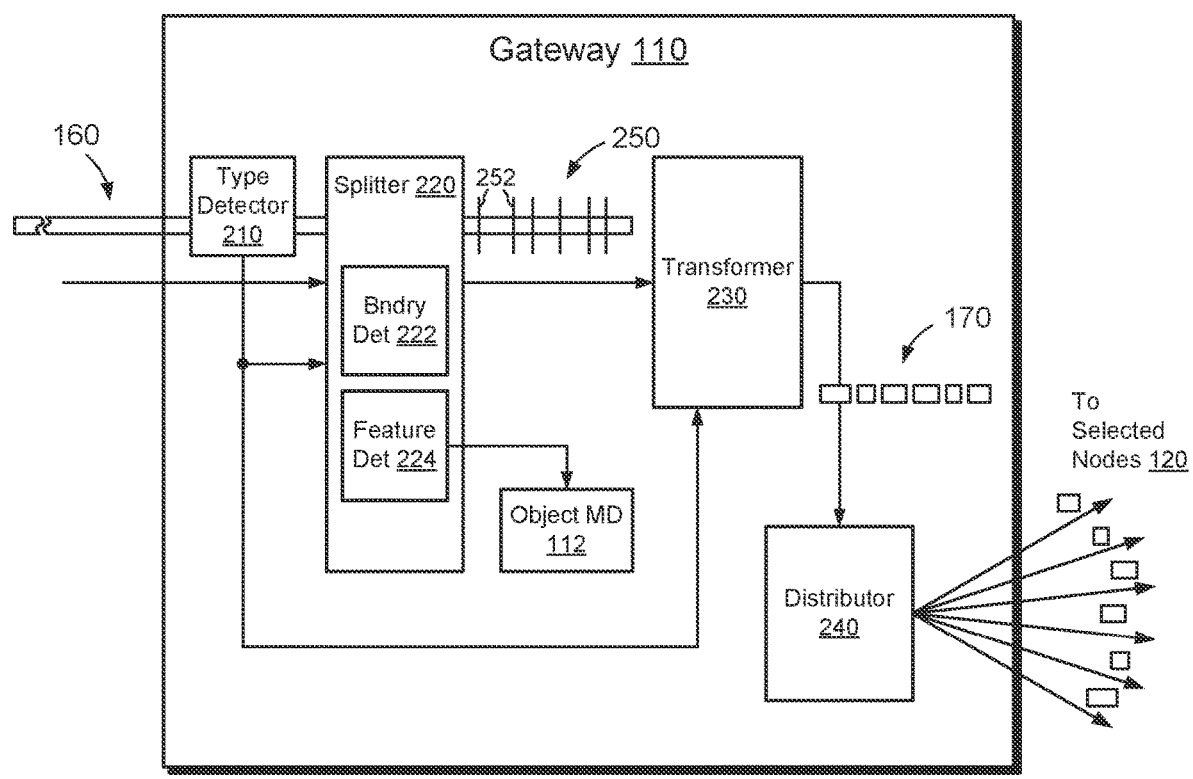
FIG. 2 is a block diagram that shows example features of a gateway device of FIG. 1 in additional detail.

FIG. 2 shows example features of the gateway 110 in additional detail. For this example, it is assumed that the gateway 110 performs the indicated functions itself. As stated previously, some of the functions may be performed by other computers, including computing nodes 120 of the cluster 130.

As shown, the gateway 110 includes a type detector 210, a splitter 220, a transformer 230, and a distributer 240. The type detector 210 performs the function of reading a set of regions of a data object 160, e.g., by sampling bytes at the beginning of the object, and identifying the object type of the data object 160 based on the sampling. The type detector 210 may inform the splitter 220 and the transformer 230 of the determined object type.

Splitter 220 performs the function of splitting the data object 160 into portions 250. The portions 250 include respective processable units of the data object 160 and are defined by boundaries 252 in the data object. A boundary detector 222 of the splitter 220 scans the data object 160 for boundaries 252, i.e., separators between the processable units, and notes the locations of the boundaries 252 relative to the data object 160 (e.g., based on byte locations). As mentioned earlier, the nature of the boundaries 252 depends upon the object type of the data object 160, which is preferably known based on operation of the type detector 210.

In some examples, such as when splitting Parquet files, the boundary detector 222 may identify every boundary 252 in the data object 160 and define a new portion 250 between each pair of boundaries. Detecting every boundary works well for Parquet files, where boundaries 252 are based on row groups, which tend to be large (e.g., in the megabyte range). If a row group is found to be unusually small, however, then a boundary may be skipped, such that multiple row groups may be included within a single portion 250. In other examples, such as when splitting CSV files, boundary detector 222 does not mark every single boundary of the data object 160, as doing so would produce an undesirably large number of small portions 250. In such cases, boundary detector 222 may wait to start detecting boundaries 252 when scanning a current portion 250 until the scanned size of the portion 250 exceeds some desired target size. Once the scan passes the target size, the boundary detector 222 may start detecting boundaries, preferably identifying the first boundary that the object contains beyond the target size. The current portion may thus end and a new portion may begin at the first detected boundary.

As the boundary detector 222 scans the object 160 for boundaries 252, a feature detector 224 may scan the object for additional features that may provide helpful information relevant to later processing. It is recognized that certain processing tasks run faster if it is known in advance that certain content is present or absent. As a particular example, certain queries of CSV files run more quickly if it is known in advance that there are no quotation marks in the data. Feature detector 224 may thus check CSV files for the presence or absence of quotation marks and update the object metadata 112 ("Features") accordingly.

With portions 250 of the data object 160 identified based on boundaries 252, transformer 230 transforms the portions 250 into respective segments 170. For example, transformer 230 modifies at least some of the portions 250 by adding metadata found in some portions to one or more other portions, so as to make such portions more amenable to independent processing, i.e., by removing dependencies between portions 250. The nature of the adjustments depends on the object type, which is known based on operation of the type detector 210. The results of operation of transformer 230 are segments 170, which provide individually processable units of the data object. For example, each of the segments 170 is rendered as the same object type as the data object 160. The segments 170 can thus be processed the same way that data objects can be processed, with the primary difference being that segments 170 are much smaller and more easily handled.

Distributor 240 then distributes the segments 170 to selected nodes 120 of the storage cluster 130 for storage in such nodes. At this time, gateway 110 updates object metadata 112 to record the locations to which the segments 170 are sent, e.g., the identities of particular nodes 120. In the manner described, the data object 160 is thus split, transformed, and distributed among nodes 120 of the storage cluster 130.

Figure 3A:
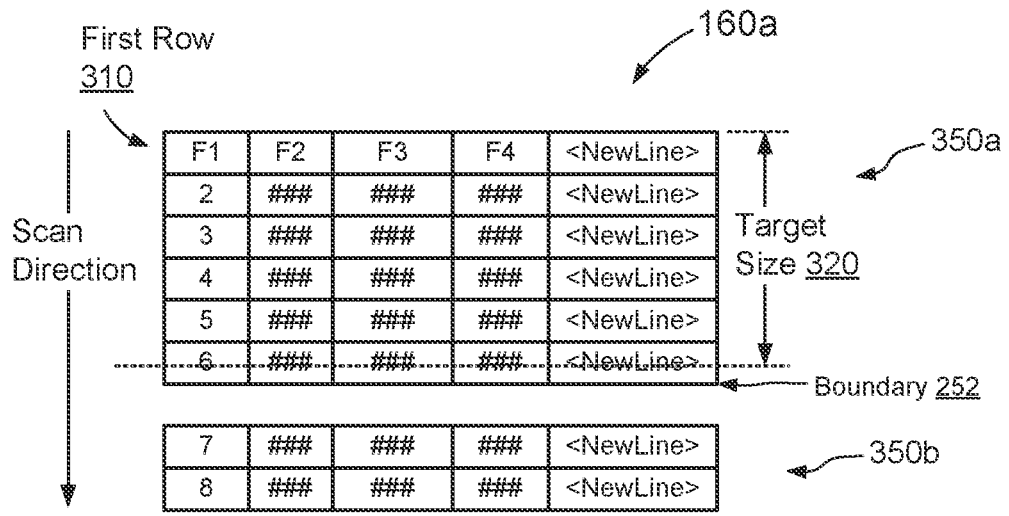
FIGS. 3A and 3B are block diagrams that show an example arrangement for splitting a data object that contains tabular data.
Figure 3B:
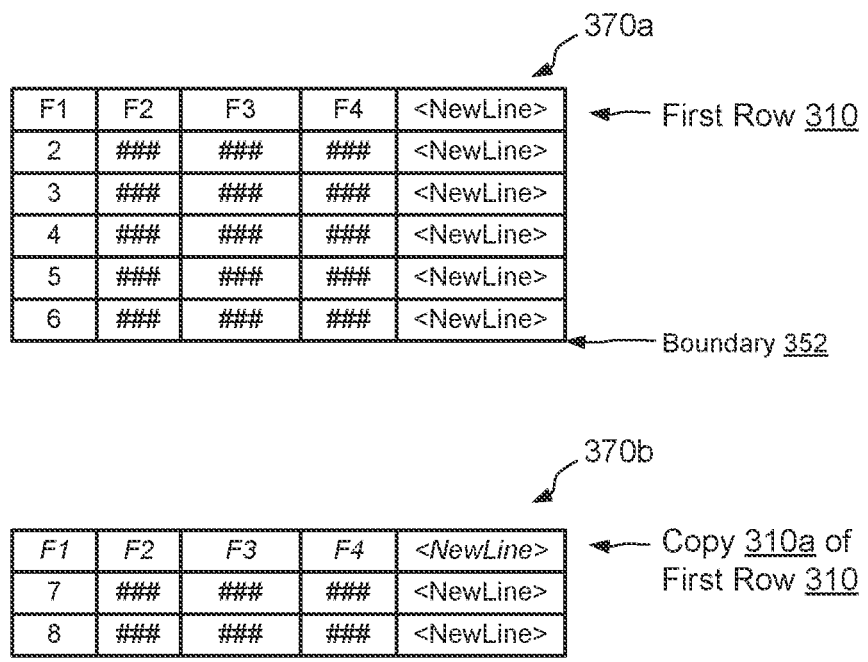

FIGS. 3A and 3B show an example arrangement for splitting and transforming a data object 160a that contains tabular data, such as a CSV file. FIG. 3A shows example results of splitting, and FIG. 3B shows example results of transforming.

As shown in FIG. 3A, the data object 160a has a first row 310 and additional rows, labeled 2 through 8 (see column 1). The data object 160a has four columns. Each row ends in a <NewLine> character, which acts as row delimiter in CSV.

When splitting the data object 160a, the splitter 220 may apply a target size 320, which defines a minimum size for portions 350 of the data object 160a. For example, the splitter 220 may identify a location (shown as a dotted line) along the data object 160a that corresponds to the target size 320, and then split the data object 160a at the first boundary that follows the identified location. In the example shown, the splitter 220 detects the NewLine character at the end of the sixth row as a first boundary 252 following the target size 320, and splits the object 160a at this location. As a result, the first six rows of object 160a form a first portion 350a, and the next two rows form the first two rows of a second portion 350b. Additional rows may be added to the second portion 350b as the splitter 220 continues to scan the object 160a.

Even though the splitter 220 has successfully separated the object 160a at a row boundary (thus avoiding having different parts of the same row assigned to different portions 350), the result of splitting may still be inefficient. For example, if the first row 310 of object 160a is a header row (e.g., a row that contains text indicating column names), then the second portion 350b would lack that header and its later processing might be compromised. For example, the header may be required for responding to certain queries or other activities. This deficiency may be addressed by transformer 230, however.

FIG. 3B shows example results of modifications made by transformer 230. Here, the portions 350a and 350b are now rendered as segments 370a and 370b, respectively. Segment 370b has been modified by insertion of a first row 310a, which is a copy of the first row 310 found in the first segment 370a. The addition of the first row 310a effectively transforms the second portion 370b into an independent processable unit. One should appreciate that the change made in segment 370b may be repeated in other segments 370 created for object 160a, such that all segments 370 are made to have the same first row 310 as that of the first segment 370a. All such segments 370 are thus made to be independently processable.

It is noted that some CSV files do not use header rows, such that the first row 310 may contain data, rather than text-based field names. In such cases, replication of the first row 310 of the first segment 370a to other segments 370 of object 160a may merely propagate redundant data. Such cases can be handled easily, however. For instance, queries or other processing tasks (e.g., arriving from clients of the storage cluster) may specify whether the CSV file represented by object 160a contains a header. If it does, then no change needs to be made, as copying the header was proper. But if the task specifies that the CSV file contains no header, then the copying turns out to have been unnecessary. In such cases, the nodes 120 that perform the distributed processing task on the CSV file may be directed simply to ignore the first row of all but the first segment 370a of segments 370. Little will have been lost as a result of copying the first row 310, which is typically negligible in size compared with that of a segment 370.

Figure 4A:
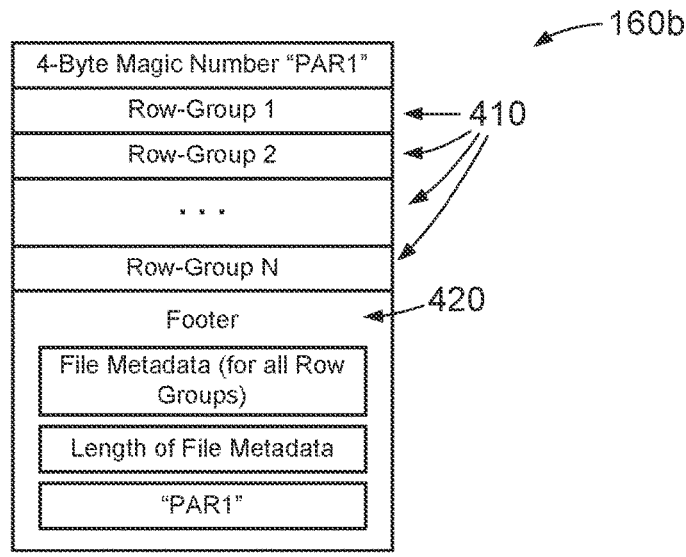
FIGS. 4A and 4B are block diagrams that show an example arrangement for splitting a data object that contains a Parquet file.
Figure 4B:
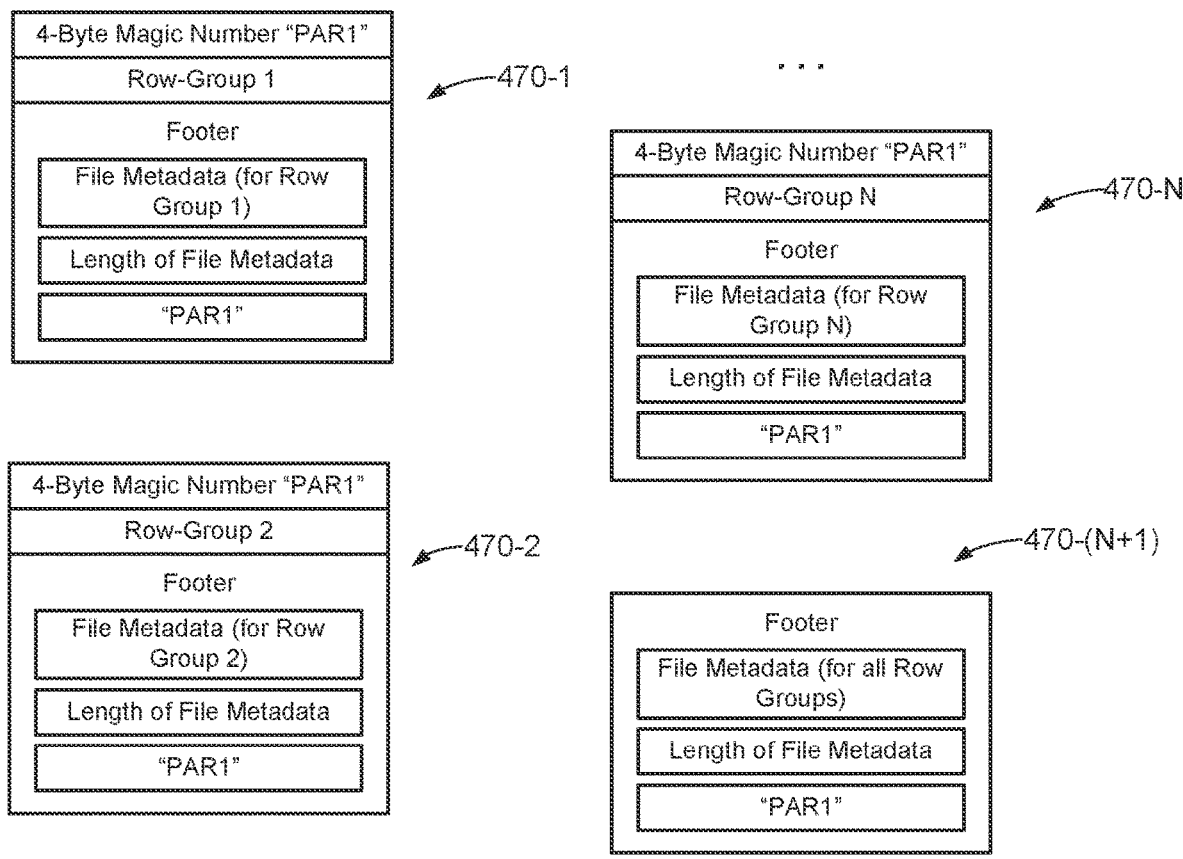

FIGS. 4A and 4B show an example arrangement for splitting and transforming a data object 160b that contains column-based data, such as a Parquet file. FIG. 4A shows an example Parquet file structure prior to splitting and transforming, and FIG. 4B shows example results after splitting and transforming.

As seen in FIG. 4A, the Parquet file 160b starts and ends with a 4-byte "Magic Number" ("PAR1"), as described above. The file 160b further includes multiple row groups 410 (1 through N, where "N" is any positive integer), and a footer 420. The row groups 410 are large structures, typically on the order of megabytes each. The footer 420 contains file metadata, which includes row-group metadata that provides locations of the row groups 410 (e.g., byte locations) within the file 160b. The footer 420 also includes a 4-byte data element that encodes the "Length of File Metadata."

Unlike the CSV example, where boundaries 252 may be detected directly while scanning forward through an object, boundaries between row groups 410 can be detected easily only by reading the footer 420. This means that splitter 220 typically makes a pass through the entire file 160a before reaching the footer 420, and then splits retrospectively. Splitting is generally performed at every row-group boundary, such that each portion 260 of the Parquet file 160b is made to contain a single row group 410. Given that row groups 410 may vary in size based on content, it may occasionally be worthwhile to place two or more row groups 410 into a single portion 260. This is a matter of design preference.

As shown in FIG. 4B, the Parquet file 160b of FIG. 4A has been rendered as N different segments 470 (470-1 through 470-N), with each segment containing a single row group. For example, segment 470-1 contains Row-Group 1, segment 470-2 contains Row-Group 2, and so on, up to segment 470-N, which contains Row-Group N.

The modifications shown in FIG. 4B, which may be implemented by transformer 230, render each row group as a self-contained Parquet file. For example, each of the segments 470-1 through 470-N contains the magic number "PAR1" at the beginning and at the end. Also, each of the segments 470-1 through 470-N contains a modified footer, which may be a modified version of footer 420. The footer in each segment 470 is prepared so that its row-group metadata is limited to only the row group (or row groups) contained in that segment, and to exclude row-group metadata for any row groups not contained in that segment. In addition, a "Length of File Metadata" is provided for each segment to reflect the actual length of the file metadata in the respective segment. Each segment 470-1 through 470-N thus presents itself as a complete Parquet file, which is amenable to independent processing just as any Parquet file would be.

In some examples, an additional segment 470-(N+1) may be provided as a final segment of the Parquet file 160b. Segment 470-(N+1) contains no row groups but rather provides a persisted version of parts of the original footer 420 of file 160b, i.e., the "File Metadata (for all Row Groups)" and the "Length of File Metadata." This segment is provided for reference and may be useful for speeding up certain processing tasks, but it is not intended to be treated as a self-contained Parquet file. Nor is it intended to be used as a source of data when performing queries.

FIGS. 5A and 5B show an example arrangement for splitting and transforming a data object 160c that contains video data, such as a video file or stream. FIG. 5A shows an example sequence of video frames prior to splitting and transforming, and FIG. 5B shows example results after splitting and transforming.

As seen in FIG. 5A, the data object 160c includes a sequence of frames 510, which in the depicted example include one or more I-frames (e.g., 510-1 and 510c), one or more P-frames (e.g., 510-2, 510-3, 510a, 510d, and 510e), and one or more B-frames (e.g., 510b). As is known, an I-frame is a video frame that contains a complete picture, relying upon no other frame for completeness. In contrast, P-frames and B-frames are incomplete and rely on other frames for completeness. P-frames typically refer back to previous frames, whereas B-frames may refer forward or back. Typically, I-frames appear much less frequently than P-frames or B-frames, as I-frames are larger and more costly to store and transmit.

Splitting video data in object 160c works much like splitting CSV data in object 160a (FIGS. 3A and 3B). For example, splitter 220 may aim to produce portions 250 that have sizes equal to or slightly greater than a target size 320. Splitter 220 attempts to find the first boundary 252 in the data object that arises after passing the target size. For detecting boundaries in video data, splitter 220 may be configured to identify I-frames, which provide natural boundaries because they do not require references to earlier or later frames. In the example shown, splitter 220 identifies the next boundary beyond the target size 320 as I-frame 510c.

Splitting the video just before I-frame 510c creates a problem, however, as B-frame 510b references I-frame 510c and thus cannot be rendered without it. If splitter 220 were to split the video immediately after B-frame 510b, then a gap in the video would appear in the segment that contains B-frame 510b. That segment would thus be incomplete, as it would have a dependency on another segment.

FIG. 5B shows an example solution. Here, the object 160c as processed so far is rendered as two segments, 570a and 570b. To resolve the dependency, segment 570a is provided with a copy 510cc of I-frame 510c. The copy 510cc provides the necessary reference from B-frame 510b and avoids a dropped video frame when rendering segment 570a. Meanwhile, segment 570b retains I-frame 510c as its first frame, thus providing an independent baseline for starting segment 570b. Subsequent frames, e.g., 510d and 510e, may rely on I-frame 510c for completeness, but none of the subsequent frames refer to any frame prior to I-frame 510c. Thus, each of the segments 570a and 570b is rendered as an independently and individually-processable unit, with no dependencies on other segments for completeness.

Figure 6:
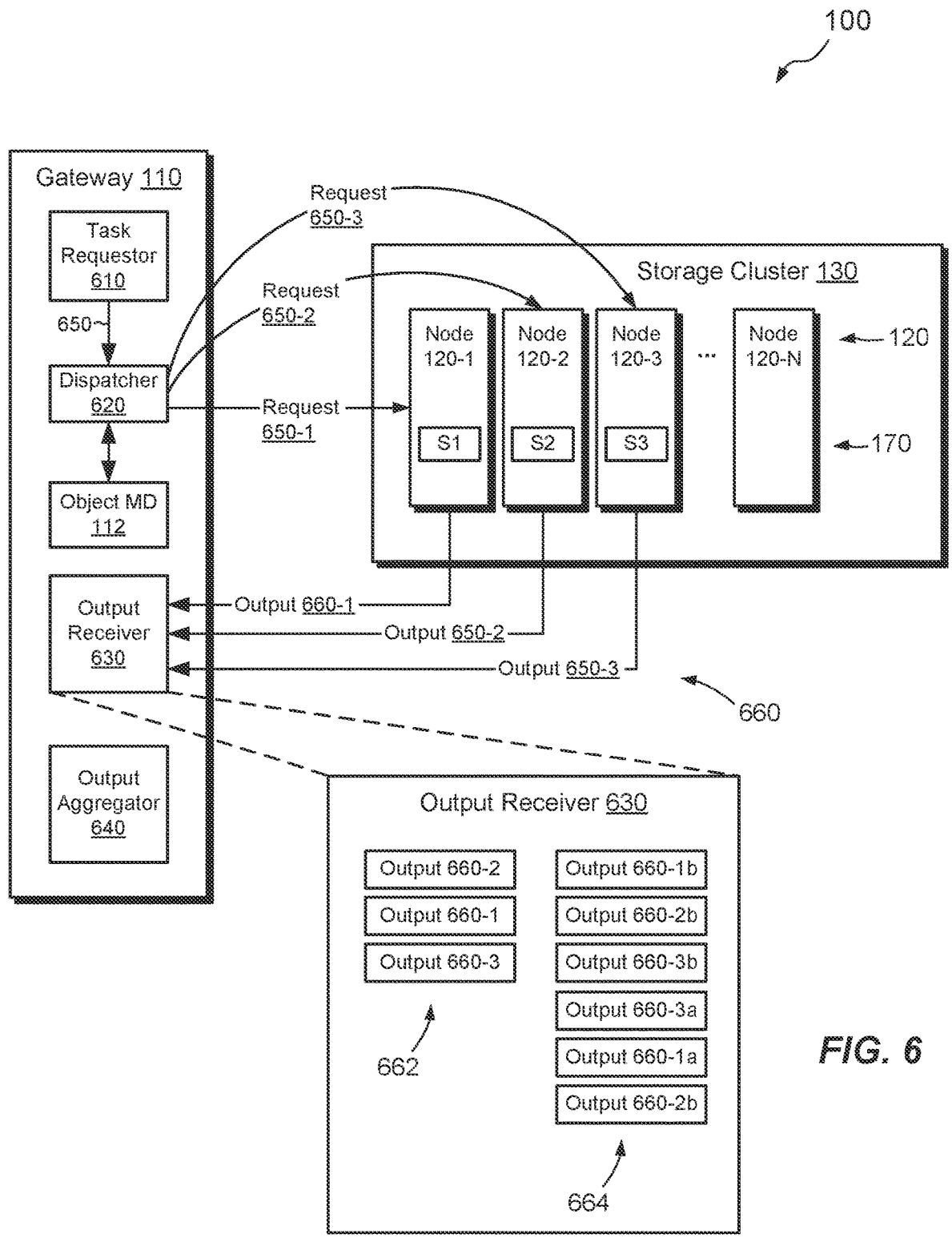
FIG. 6 is a block diagram showing an example arrangement for performing a distributed processing task in the environment of FIG. 1.

FIG. 6 shows an example arrangement for performing distributed processing in accordance with additional embodiments. The depicted arrangement may be implemented in the environment 100 of FIG. 1 or in other environments. The ensuing description assumes an implementation in the environment 100, such that the above-described features form parts of the instant embodiments. In other examples, the FIG. 6 arrangement may be implemented in other environments having different features. Therefore, the features described above should be regarded as illustrative examples but not as required unless specifically indicated.

As shown in FIG. 6, the gateway 110 includes components that support its role in performing distributed processing. These include a task requestor 610, a dispatcher 620, an output receiver 630, and an output aggregator 640, in addition to the above-described object metadata 112.

In example operation, the task requestor 610 initiates a request 650 for performing a processing task on a specified data object 160 (or set of objects 160). Various types of tasks are contemplated. These may include, for example, reads and/or queries of specified data (e.g., for tabular or tree-based data objects). Types of queries may include SQL (Simple Query Language) queries, key-value lookups, noSQL queries, and the like. Tasks for video data objects may include distributed video-processing tasks, such as searches for specified graphical content (e.g., faces, license plates, geographical features, and the like). Tasks for audio data objects may include searches for spoken words, voice characteristics (e.g., tone, accent, pitch, etc.), particular sounds, or the like. Essentially, any task that is amenable to splitting among multiple nodes 120 and involves access to potentially large amounts of data is a good candidate for processing in the arrangement of FIG. 6.

Upon issuance of the request 650, dispatcher 620 begins distributing components of the requested task to the respective nodes 120. For example, dispatcher 620 checks object metadata 112 to identify segments 170 of the specified data object 160 (or set of objects) and their respective locations in the storage cluster 130. In the simplified example shown, the object metadata 112 identifies three segments 170 (e.g., S1, S2, and S3), which make up the data object 160 (typical results may include tens or hundreds of segments) and three computing nodes 120-1, 120-2, and 120-3 that store the respective segments 170.

Dispatcher 620 then transmits requests 650-1, 650-2, and 650-3 to the identified nodes 120-1, 120-2, and 120-3, respectively. Requests 650-1, 650-2, and 650-3 may be similar or identical to request 650, e.g., they may provide the same query or other task as specified in request 650. Such requests 650-1, 650-2, and 650-3 need not be identical to one another, however. For example, some requests may include segment-specific metadata (e.g., stored in object metadata 112) that differs from that sent in other requests, and which may be used to guide a processing task on a particular node.

The identified nodes 120-1, 120-2, and 120-3 receive the requests 650-1, 650-2, and 650-3, respectively, and each of these nodes begins executing the requested task on its respective segment. For example, node 120-1 executes the task on segment S1, node 120-2 executes the task on segment S2, and node 120-3 executes the task on segment S3. In an example, each node 120 independently executes its respective task on its respective segment 170, without needing to contact any other node 120. For instance, node 120-1 completes its work by accessing only S1, without requiring access to S2 or S3. Likewise for the other nodes.

As the nodes 120-1, 120-2, and 120-3 perform their respective work, such nodes produce respective output 660, shown as output 660-1 from node 120-1, output 660-2 from node 120-2, and output 660-3 from node 120-3. The participating nodes send their respective output 660 back to the gateway 110, which collects the output in output receiver 630.

As shown in the expanded view near the bottom of FIG. 6, output receiver 630 may receive output 660 from participating nodes 120 in any order. In a first scenario, the nodes 120-1, 120-2, and 120-3 are configured to wait for their respective tasks to complete before sending back their output. In this case, the output 660 from a particular node may arrive all at once, with output from different nodes arriving at different times, based on their respective times of completion. Output data 662 shows example results according to this first scenario. Here, output 660-2 from node 120-2 arrives first and thus appears first in the output data 662, followed by output 660-1 (from node 120-1), and then by output 660-3, which arrives last (from node 120-3). Output 660 is thus interleaved in the output data 662.

In a second scenario, nodes 120-1, 120-2, and 120-3 are configured to return their output in increments, such as immediately upon such increments becoming available. In this second scenario, each participating node may return its output 660 in multiple transmissions, which may be spread out over time. Output data 664 shows example results according to this scenario. Here, output data 664 is seen to include six different batches (660-1a, 660-1b, 660-2a, 660-2b, 660-3a, and 660-3b), i.e., two batches of output from each of nodes 120-1, 120-2, and 120-3. The batches appear in output data 664 in the order received, which thus may be interleaved at finer granularity than was seen in the first scenario.

Of course, gateway 110 may sort the output 660 in any desired manner, and any node 120 of the storage cluster 130 may be called upon to perform this task. In some examples, both the affected nodes and the gateway 110 may participate in sorting the output 660. For example, each of the nodes may sort its respective output, such that each of the results 660-1, 660-2, or 660-3 arrives individually in sorted order. The gateway 110 may then complete the work, e.g., by employing the aggregator 640 for sorting among the sorted sets of returned results.

Sorting takes time, and many processing tasks value speed more highly than sorted output. To further promote high-speed operation, the computing nodes 120 may in some examples employ RDMA (remote direct memory access) when returning output 660 to the gateway 110.

For some processing tasks, dispatcher 620 may send processing requests to all involved nodes (i.e., to all nodes that store segments of the subject data object). In other examples, dispatcher 620 may limit the nodes to which requests are sent, e.g., based on knowledge of a priori segment contents, byte ranges of segments, or other factors. Limiting the number of involved nodes in this manner helps to reduce traffic over the network 140 (FIG. 1), further promoting efficiency.

Some processing tasks may involve aggregation. For example, a query may request a count of records that meet specified criteria, rather than the records themselves. A query may also request an average value, a maximum value, a minimum value, or some other aggregate value. Nodes 120 may perform certain aggregate functions themselves (e.g., count, total, max, min, etc.), but individual nodes 120 do not typically aggregate output across multiple nodes. Rather, this function may be performed by the data aggregator 640. For example, aggregator 640 may receive counts from multiple nodes, with each providing partial aggregate results derived from its processing on a respective segment. Aggregator 640 may then sum the counts from the responding nodes to produce an aggregate total for the entire data object 160. To produce an aggregated average for a data object, for example, aggregator 640 may direct each participating node to provide both a count and a total. It may then sum all counts returned to produce an aggregate count, sum all totals to produce an aggregate total, and then divide the aggregate total by the aggregate count to produce the desired aggregate average. Other types of aggregate functions may be performed in a similar way.

One should appreciate that the arrangement of FIG. 6 may perform aggregate queries at exceedingly low cost in terms of bandwidth. As each participating node computes a local aggregate and returns only its results, aggregate queries can run across very large datasets and produce very little output 660, which may normally be less than 1 kB and may often be as little as a few bytes.

Although the gateway 110 has been shown and described as the originator of task requests 650, as the dispatcher of requests to affected nodes, and as the collector of output 660 from the nodes, these functions may alternatively be performed by other computers, or by multiple computers. Indeed, they may be performed by one or more nodes 120 of the storage cluster 130. The example shown is thus intended to be illustrative rather than limiting.

Figure 7:
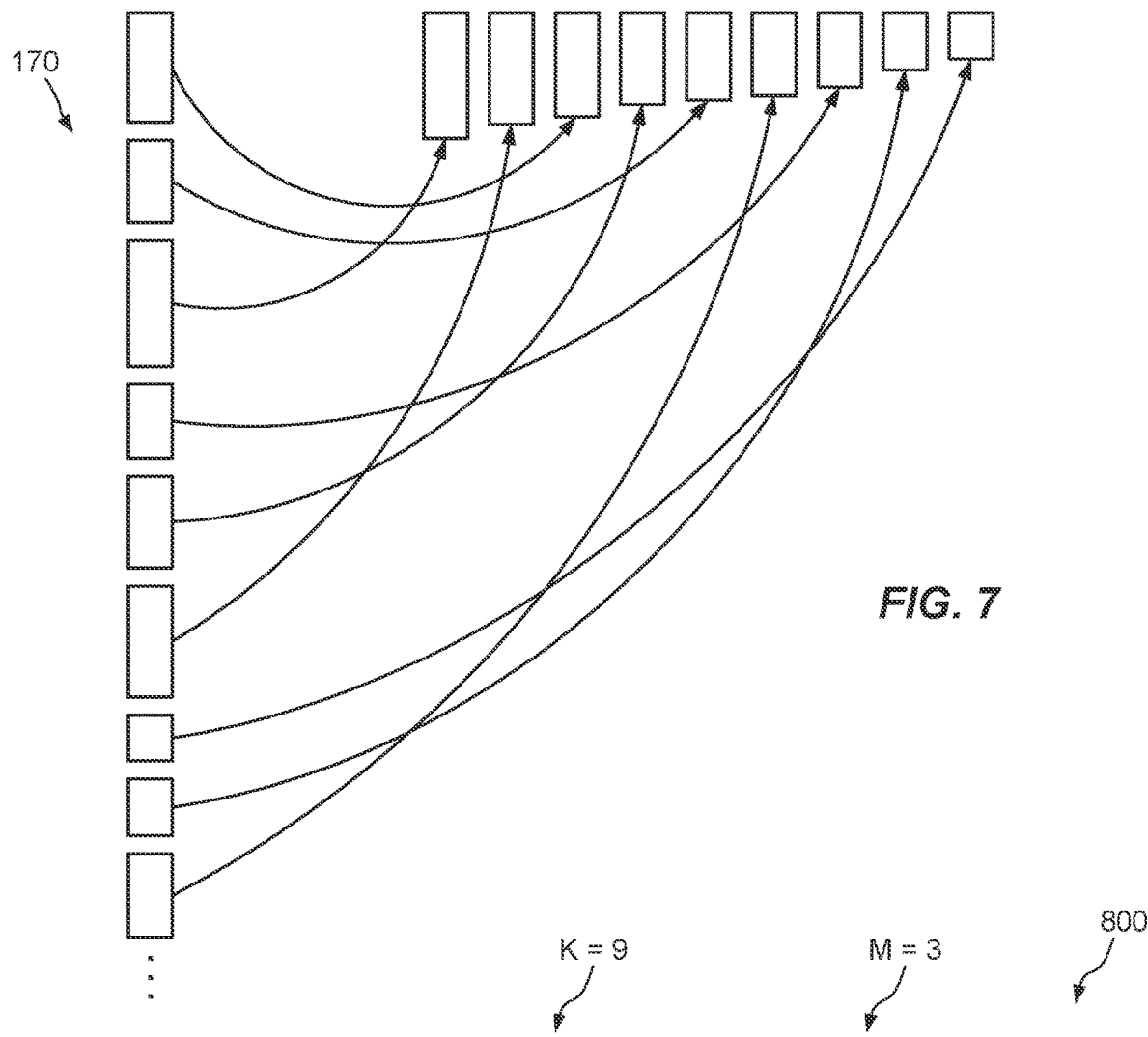
FIG. 7 is a block diagram showing an example arrangement of multiple segments of a data object in order of decreasing size.
Figure 8:
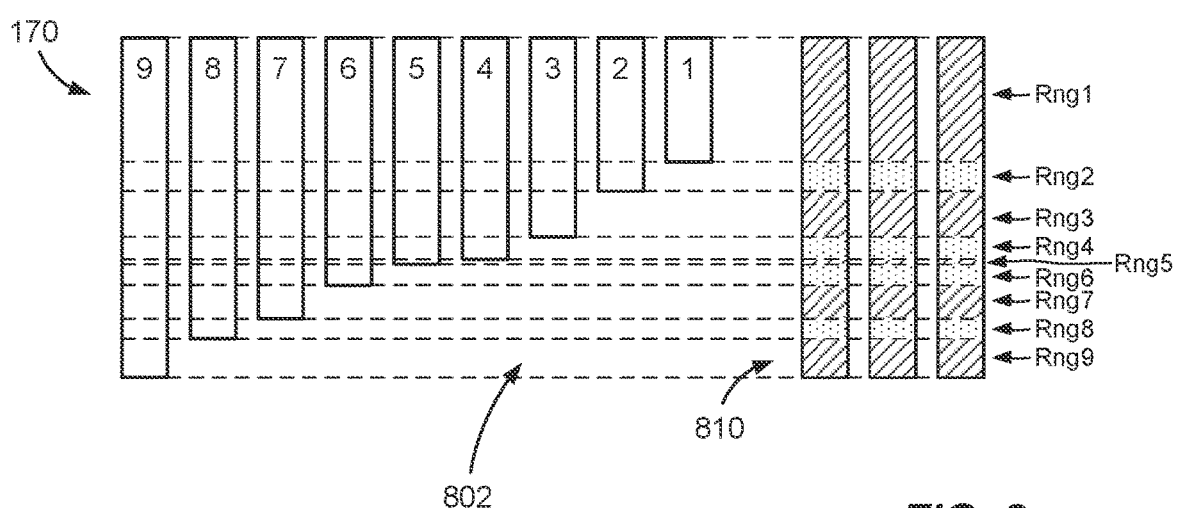
FIG. 8 is a block diagram showing an example arrangement for erasure coding the segments shown in FIG. 7.

FIGS. 7 and 8 show an example arrangement for performing data protection of segments 170 in accordance with additional embodiments. The depicted arrangement of FIGS. 6 and 7 may be implemented in the environment 100 of FIGS. 1 and/or 6 or in environments different from those illustrated above.

FIG. 7 shows multiple segments 170 that have been produced from a single data object 160, with the segments 170 arranged vertically. Although not required, the segments 170 may be arranged in order, in this case with the earliest-created segment (closest to the beginning of the object) appearing on top and with vertically adjacent segments 170 corresponding to adjacent portions of the data object 160. Nine (9) segments 170 are shown, with the understanding that many more than nine segments 170 may be produced from the data object 160. In an example, the depicted nine segments 170 are the first nine segments produced from the data object (e.g., by splitter 220 and transformer 230; FIG. 2).

Notably, the segments 170 have different respective lengths. It is thus possible to rank the segments 170 in order of length, e.g., from longest to shortest, as shown at the top-right of the figure.

FIG. 8 shows an enlarged view of the same ranked segments 170. Here, K+M erasure-code processing is performed on the nine segments (K=9) (e.g., by gateway 110) to generate M=3 elements 810 of repair data, which provide various forms of parity information. The K segments together with the M repair elements make up a repair group 802 that includes a total of 12 elements overall.

The depicted repair group 802 allows for damage to up to M elements prior to experiencing data loss. The damaged elements may be any elements of the repair group 802, which may include data segments 170 and/or repair elements 810, in any combination. Complete recovery and repair can be achieved as long as no greater than M total elements are damaged. One should appreciate that the choices of K=9 and M=3 may be varied, based upon a desired level of data protection, among other factors. In an example, repair elements 810 are generated using a computationally efficient procedure 800 that appears to be entirely new.

Prior erasure-coding schemes may require all K data elements to have equal length. If data elements have unequal lengths, then zero padding may be used to make the lengths equal. Parity calculations are then performed using the full length of all K data elements, producing M parity elements having the same length as the K data elements.

In contrast with the usual erasure-coding approach, the procedure 800 generates repair elements from data elements that have unequal lengths. No zero-padding is required. In an example, procedure 800 proceeds by logically aligning the segments 170, i.e., the K=9 data elements. For example, the segments 170 may be aligned at their respective tops, as shown. Alternatively, the segments 170 may be aligned at their respective bottoms (not shown) or may be aligned in some other known way. Note that such alignment is logical rather than physical, as no actual movement of any segment 170 is required. Also, the depicted ranking of segments 170 should be understood to be logical rather than physical.

With the segments 270 logically aligned, the procedure 800 proceeds by identifying the shortest segment 170 (labeled "1") and identifying a corresponding range (Rng1). Rng1 aligns with Segment 1 and has the same size and limits. As Segment 1 is the shortest segment and the segments 170 are logically aligned, all of the K segments 170 (Segments 1-9) have data within Rng1. Using the Rng1 data across Segments 1-9, the procedure computes M sets of repair data, one set for each of the M repair elements 810, and places the repair data in the respective repair elements 810 at the location of Rng1. Repair data for Rng1 is thus complete, and such repair data is based on all K segments 170. One should appreciate that the computations herein of repair data may be similar to what is used in conventional K+M erasure coding, the details of which are not critical to embodiments and are not described further.

The procedure 800 then continues in a similar manner for additional ranges. For example, Rng2 corresponds to the part of Segment 2 that extends beyond Segment 1, i.e., the part of Segment 2 for which no repair data has yet been computed. As Segment 1 has no data in Rng2, repair data for Rng2 may be computed using only the corresponding parts of Segments 2-9 (i.e., a total of K−1 segments). As before, the procedure computes M sets of repair data, one set for each of the M repair elements 810, and places the repair data in the respective repair elements 810, this time at the location of Rng2. Repair data for Rng2 is thus complete, but such repair data is based on only K−1 segments 170.

The procedure 800 may continue in this manner for each of ranges Rng3 through Rng8, with the computations of repair data for each range involving one fewer segment than do the computations for the immediately preceding range. Thus, the computations for Rng3 involve K−2 segments, the computations for Rng4 involve K−3 segments, and so on, with the computations for Rng8 involving only K−7 segments, i.e., Segments 8 and 9. It is noted that no computation is needed for Rng9, as Rng9 intersects only a single segment (Segment 9). Rather than computing repair data for Rng9, the procedure 800 instead stores replicas (copies) of the affected data, i.e., the portion of Segment 9 within Rng9. A separate copy of the Rng9 data may be provided at the Rng9 location of each of the repair elements 810.

The erasure-coding procedure 800 is typically faster to compute than conventional erasure coding. Instead of requiring all K data elements for computing repair data of M repair elements 810, the procedure 800 requires K data elements for only the shortest data element. For each next-shortest data element, the procedure 800 requires one fewer data element, eventually requiring only two data elements, and thus reduces computational complexity and execution time.

One should appreciate that segments 170 as produced from objects 160 may be protected using the erasure-coding procedure 800. For example, when distributing segments 170 to computing nodes 120 for storage in the cluster 130, gateway 110 (or some other computer) may perform the procedure 800 to generate repair elements 810 at reduced computational cost. The procedure 800 may operate with K segments 170 at a time, producing M repair elements for each, and forming respective repair groups 802 for each set of K+M elements.

Figure 9:
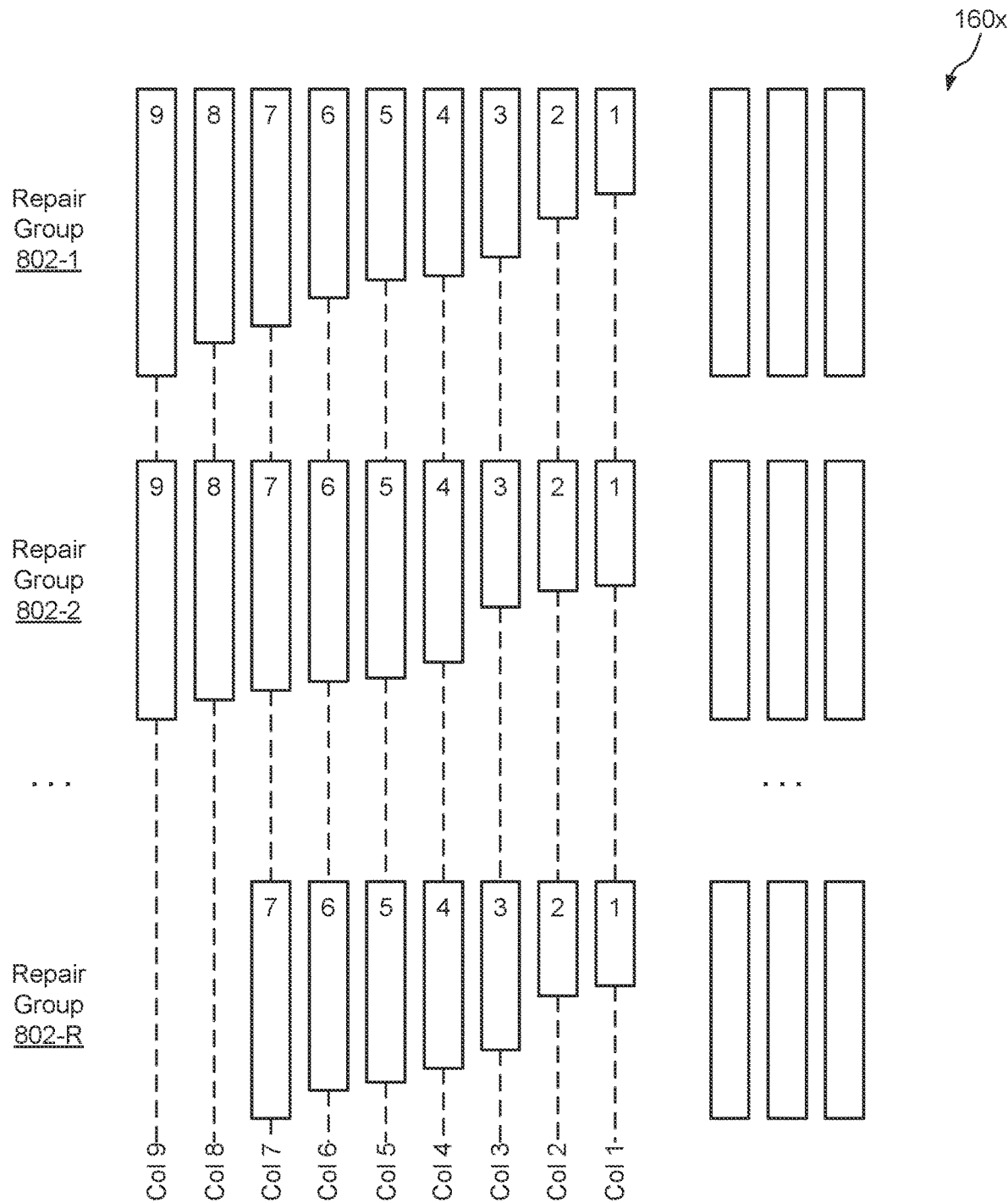
FIG. 9 is a block diagram showing multiple repair groups formed from segments created from a data object.

FIG. 9 shows an example arrangement of multiple repair groups 802, which may be used for protecting a particular data object 160x. As shown, repair groups 802-1, 802-2, and so forth up to 802-R, provide data protection for data object 160x, e.g., using the erasure-coding procedure 802. The first repair group 802-1 includes and protects a first group of K segments 170 produced from the data object 160x, the second repair group 802-2 includes and protects a second group of K segments 170 produced from the same data object 160x, and so on, up to the $R^{th}$ repair group 802-R, which protects a last group of segments 170. It is noted that repair group 802-R contains fewer than K segments. For example, the data object 160x may have ended (run out of data) after producing only seven segments. The segments 170 that make up the repair groups 802 are seen to be arranged in columns (Col 1 to Col 9), with each column corresponding to a respective one of the K elements.

It should be appreciated that erasure coding may place certain constraints on data placement. For example, no two segments 170 that belong to the same repair group 802 should normally be stored on the same disk drive (e.g., SSD, magnetic disk drive, etc.), as doing so would undermine the redundancy of the erasure coding and subject the segments to an increased risk of data loss. For similar reasons, no two segments 170 that belong to the same repair group 802 should normally be stored on the same computing node 120, as doing so would reduce redundancy, e.g., in the event of a failure of the computing node 120. These rules do not typically apply across different repair groups 802, however. For example, no substantial loss of redundancy results from storing segments 170 that belong to different repair groups 802 on the same computing node 120, as long as no two segments belong to the same repair group 802. For example, it may be permissible for a single computing node 120 to store one segment 170 from each of the R repair groups that protect a given data object 160 (a total of R segments of the same data object).

It should further be appreciated that erasure coding is but one way to protect data, with another way being replication. In an example, data objects 160 and their associated repair data and/or replicas reside in buckets of an object store, and data protection schemes are applied on a per-bucket basis. A bucket that uses replication for its data protection will thus use replication for protecting all of its contents, including all objects 160 contained therein. Likewise, a bucket that uses erasure coding for its data protection will use erasure coding for all of its contents. Erasure coding parameters K and M may also be selected and applied on a per-bucket basis. Thus, the arrangement in FIG. 9 may use erasure coding with K=9 and M=3 because the bucket that contains object 160x uses these settings, which are thus applied globally to all contents of the bucket.

Figure 10:
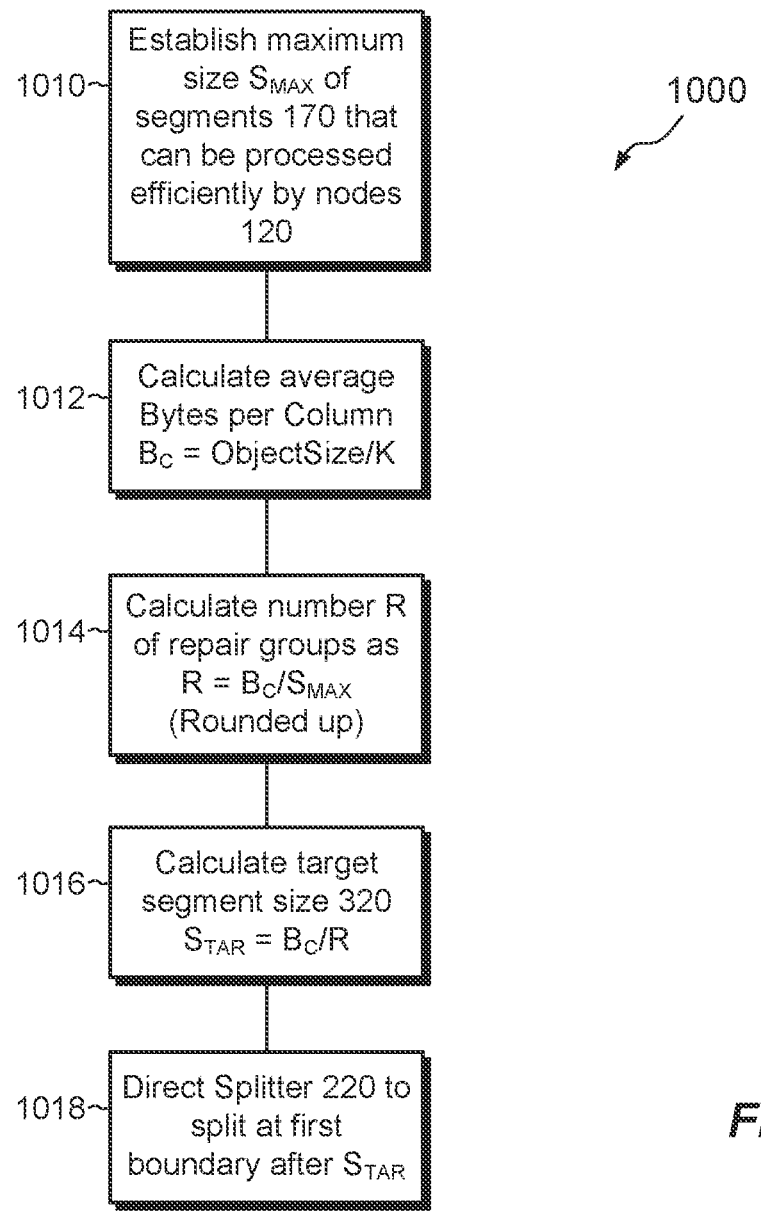
FIG. 10 is a flowchart showing an example method of determining a desired target size of segments.

FIG. 10 shows an example method 1000 for determining various quantities used in managing a data object 160 and its segments 170. The method 1000 assumes data protection using erasure coding, and may be used for determining a desired target size 320 of segments 170 (FIG. 3), as well as a number R of repair groups 802 to be used for protecting the data object 160 (FIG. 9). The method 1000 may be performed, for example, by the gateway 110, by a node 120 of the storage cluster 130, or by some other computer that can connect to the cluster 130. At the beginning of method 1000, the size of the data object 160 and the number K (as used in K+M erasure coding) are assumed to be known in advance.

At 1010, the method 1000 establishes a maximum size $S_{MAX}$ of segments 170 that can be processed efficiently by nodes 120. The maximum size may be based on practical considerations, such as hardware specifications of nodes 120 (e.g., clock speed, number of cores, amount of memory, and so forth), as well as expected latency to processing tasks and expectations of users. Typical ranges of $S_{MAX}$ may fall between several hundred kilobytes and several megabytes, for example.

At 1012, the method computes an average number of bytes per column, $B_C$. In an example, the value of $B_C$ may be based upon the size "ObjectSize" of the data object 160 and on the number K used in the K+M erasure coding used to protect the data object 160. For example, $B_C$=ObjectSize/K. Referring briefly back to FIG. 9, it can be seen that $B_C$ represents the average amount of per-column data in a depicted column.

At 1014, the method 1000 calculates a number R of repair groups, e.g., by dividing $B_C$ by $S_{MAX}$ and rounding up to the nearest integer. More specifically, the number of repair groups may be calculated as R=$B_C$/$S_{MAX}$, rounded up.

At 1016, the method calculates the target segment size 320 as $S_{TAR}$=$B_C$/R. The resulting quantity $S_{TAR}$ may be provided to splitter 220, e.g., in determining where to start searching for boundaries 252 when splitting the data object 160.

At 1018, the method 1000 directs the splitter 220 to split the data object 160 in a way that produces portions 250 that are at least as large as $S_{TAR}$, e.g., to produce portions 250 that extend to the next boundary 252 beyond $S_{TAR}$.

Method 1000 thus provides useful guidelines for establishing the target segment size 320 and the number R of repair groups to be used for a particular data object 160. Actual selections of these quantities may involve the discretion of administrators and may be driven by other factors besides those described. Thus, the method 1000 is intended to be advisory rather than required.

Figure 11:
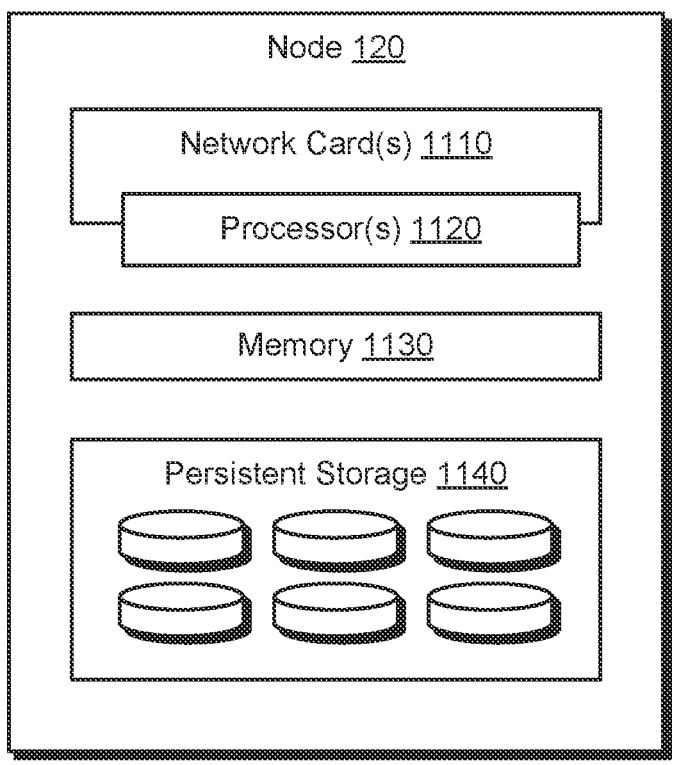
FIG. 11 is a block diagram of an example computing node that may be used in the environment of FIGS. 1 and 6.

FIG. 11 shows an example computing node 120 in additional detail. The computing node 120 is intended to be representative of the computing nodes 120-1, 120-2, and 120-3 of the storage cluster 130. It is also intended to be representative of the gateway 110 of FIG. 1.

As shown, computing node 120 includes one or more communication interfaces, such as one or more network interface cards (NICs) 1110, a set of processors 1120, such as one or more processing chips and/or assemblies, memory 1130, such as volatile memory for running software, and persistent storage 1140, such as one or more solid-state disks (SSDs), magnetic disk drives, or the like. The set of processors 1120 and the memory 1130 together form control circuitry, which is constructed and arranged to carry out various methods and functions as described herein. Also, the memory 1130 includes a variety of software constructs, such as those shown in FIGS. 1 and 2, which are realized in the form of executable instructions. When the executable instructions are run by the set of processors 1120, the set of processors 1120 carry out the operations of the software constructs. In an example, one or more of the set of processors 1120 may reside in the network card(s) 1110, which may facilitate high-speed communication over the network 140, thus promoting bandwidth and efficiency.

Figure 12:
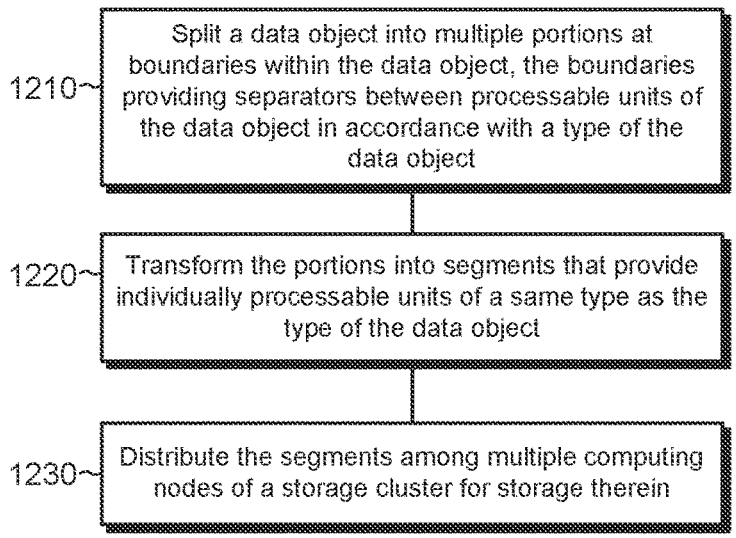
FIG. 12 is a flowchart showing an example method of managing data objects in accordance with one embodiment.
Figure 12:
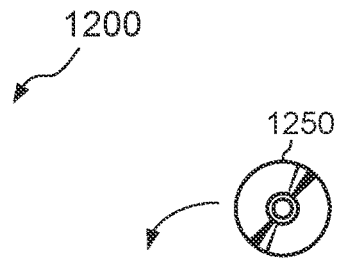
Figure 13:
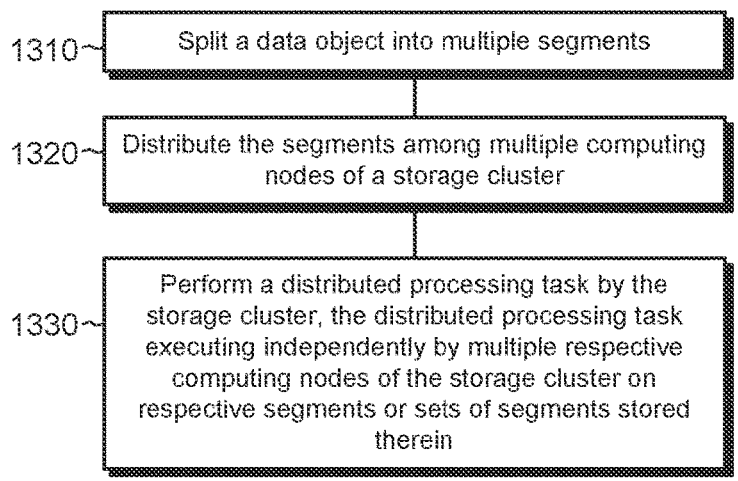
FIG. 13 is a flowchart showing an example method of managing data objects in accordance with another embodiment.
Figure 13:
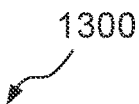
Figure 14:
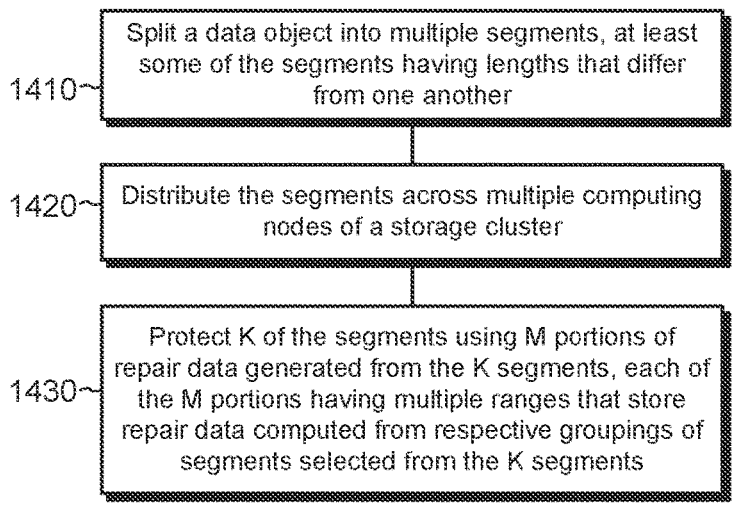
FIG. 14 is a flowchart showing an example method of managing data objects in accordance with yet another embodiment.
Figure 14:

FIGS. 12, 13, and 14 show example methods 1200, 1300, and 1400, which may be carried out in connection with the environment 100 and provide a summary of some of the features described above. The methods 1200, 1300, and 1400. Such methods are typically performed, for example, by the software constructs described in connection with FIGS. 1 and 2. The various acts of methods 1200, 1300, and 1400 may be ordered in any suitable way. Accordingly, embodiments may be constructed in which acts are performed in orders different from those illustrated, which may include performing some acts simultaneously.

FIG. 12 shows an example method 1200 of managing data objects. At 1210, a data object 160 is split into multiple portions 250 at boundaries 252 within the data object 160 (see FIG. 2). The boundaries 252 provide separators between processable units 250 of the data object 160 in accordance with a type of the data object (e.g., CSV, JSON, XML, Parquet, video, and so forth). At 1220, the portions 250 are transformed into segments 170 that provide individually processable units of a same type as the type of the data object 160. For example, data and/or metadata may be copied from one portion 250 to other portions, and other modifications may be made, to reduce or eliminate dependencies between and among segments 170. At 1230, the segments 170 are distributed among multiple computing nodes 120 of a storage cluster 130 for storage therein.

FIG. 13 shows an example method 1300 of managing data objects. At 1310, a data object 160 is split into multiple segments 170, e.g., by operation of splitter 220 (FIG. 2). At 1320, the segments 170 are distributed among multiple computing nodes 120 of a storage cluster 130. At 1330, a distributed processing task is performed by the storage cluster 130. The distributed processing task executes independently by multiple respective computing nodes 120 of the storage cluster 130 on respective segments 170 or sets of segments 170 stored therein.

FIG. 14 shows an example method 1400 of managing data objects. At 1410, a data object 160 is split into multiple segments 170, at least some of the segments 170 having lengths that differ from one another (see FIGS. 7 and 8). At 1420, the segments 170 are distributed across multiple computing nodes 120 of a storage cluster 130. At 1430, K of the segments 170 are protected using M elements 810 of repair data generated from the K segments, each of the M elements 810 having multiple ranges (e.g., Rng1, Rng2, etc.) that store repair data computed from respective groupings of segments selected from the K segments (e.g., one grouping with K segments, one grouping with K−1 segments, and so forth).

An improved technique for managing data objects 160 in a storage cluster 130 includes splitting a data object 160 into multiple portions 250 at boundaries 252 within the data object 160. The technique further includes transforming the portions 250 of the data object 160 into segments 170 that provide individually processable units, and distributing the segments 170 among multiple computing nodes 120 of the storage cluster 130 for storage therein.

Section II: Partitioning, Processing, and Protecting Compressed Data

This section describes examples of managing compressed data. One should appreciate that any of the features and methodology as described in the above Section I may also be used in embodiments described in this Section II. Certain embodiments of Section II may be used independently of those described in Section I, however. Thus, and unless specifically indicated to the contrary, the features of Section I should not be regarded as required or necessary for any of the Section-II features described below.

Overview of Section-II Content:

An improved technique of partitioning compressed data includes receiving the compressed data in a file or stream and splitting the file or stream into multiple segments that store respective compressed portions of the file or stream. The technique further includes storing a decompression state in association with a current segment, the decompression state based on data of a previous segment and enabling decompression of the current segment independently of other segments.

In some examples, the decompression state stored in association with the current segment provides a dictionary formed from a range of decompressed data of the previous segment.

In some examples, the range of decompressed data has a predetermined length and extends to an end of the previous segment.

Some examples further include storing a range of decompressed data that appears at an end of the current segment in association with a next segment of compressed data, as a decompression state of the next segment.

In some examples, the compressed file or stream includes a sequence of blocks (e.g., deflate blocks), and splitting the file or stream into multiple segments is performed at borders between adjacent blocks.

In some examples, the compressed data is compressed using the Deflate algorithm as used by ZLIB, which is commonly used by the popular GZIP software.

In some examples, the technique further includes storing object metadata that associates segments formed from the file or stream with respective byte ranges of the file or stream contained in the segments. In some examples, the byte ranges stored in the object metadata include ranges of compressed data. In some examples, the byte ranges stored in the object metadata include ranges of uncompressed data. In some examples, the byte ranges stored in the object metadata include both ranges of compressed data and ranges of uncompressed data. In some examples, the object metadata permits access to data of the compressed file or stream based on compressed byte locations and/or based on uncompressed byte locations.

In some examples, the technique further includes storing object metadata that associates segments with respective ranges of rows or records of data stored in those segments. The ranges of rows or records may be identified by number (e.g., first row, second row, hundredth row, etc.). In a particular example, the object metadata may indicate the number of the first row or record and the count of rows or records stored in an associated segment. Storing ranges of rows or records facilitates lookups based on row or record numbers.

In some examples, splitting the file or stream into multiple segments is performed without regard to content of the data of the compressed file or stream.

In other examples, splitting the file or stream into multiple segments is performed with regard to the content of the compressed file or stream.

For example, splitting the file or stream may be performed in a manner that keeps related data together.

In an example, splitting may include identifying a target location for a split based on a target size of segments, but then splitting the file or stream at a location different from the target location so as to keep related data together.

In some examples, splitting may include decompressing at least some data of the file or stream and locating a natural boundary in the decompressed data, such as the end of a row of CSV data, the end of a JSON record, a key frame (IDR frame) of video data, or the like. In such examples, splitting further includes locating a split location in the file or stream as the first block border that follows the located natural boundary.

In some examples, the technique further includes storing fix-up data, which appears between the natural boundary and the split location, in metadata of a next segment.

In some examples, the technique further includes marking a location of the natural boundary in metadata of at least one of the current segment and the next segment.

In some examples, the fix-up data has a length that does not exceed a length of the range of decompressed data that forms a dictionary of the next segment. In such cases, storing the fix-up data is done as part of storing the dictionary in the metadata of the next segment and no additional storage is required.

In other examples, the fix-up data has a length that exceeds the length of the range of decompressed data of the dictionary. In such cases, storing the fix-up data includes storing additional fix-up data, i.e., that which extends beyond the dictionary, in the metadata of the next segment.

In some examples, the technique further includes identifying descriptive content, such as headers and/or footers, in the decompressed data of a current segment and storing the descriptive content in metadata of the next segment to facilitate independent processing of data in the next segment.

In some examples, the technique further includes storing, protecting, and/or processing the segments in any of the ways described for segments in Section I.

The foregoing "Overview of Section-II Content" is presented for illustrative purposes to assist the reader in readily grasping example features presented herein; however, this overview is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

Figure 15:
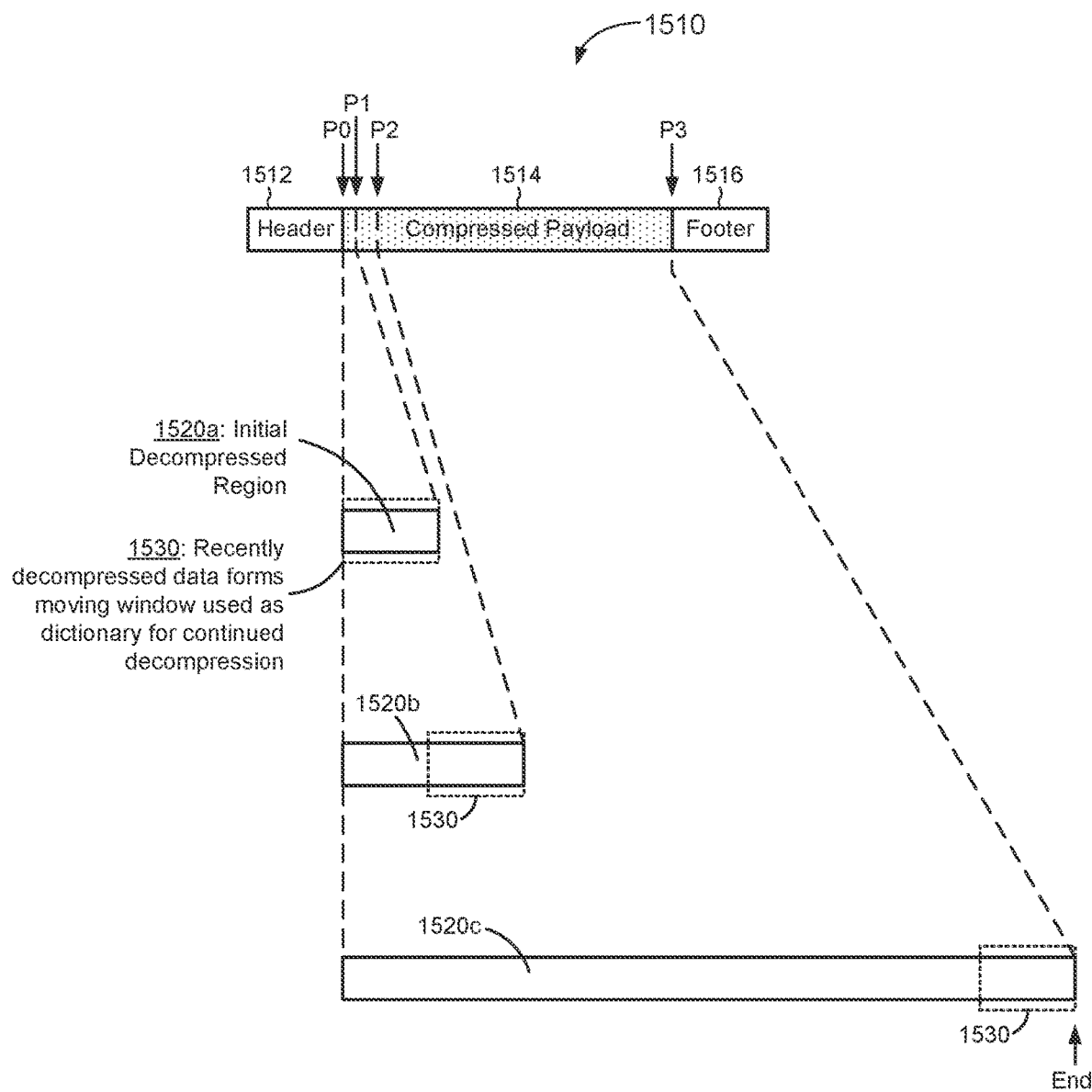
FIG. 15 is a block diagram showing an example arrangement for decompressing compressed data using a sliding dictionary.

Description of Section-II Content:

FIG. 15 shows an example arrangement for decompressing a compressed file 1510. The file 1510 is of a type that is amenable to splitting in accordance with improvements hereof. For example, the file 1510 may be compressed using the Deflate algorithm as used by ZLIB, which is commonly used by the popular GZIP software, or some other type of file that can be decompressed in the manner shown. Further information about ZLIB may be found at http://zlib.net/. Further information about the Deflate algorithm in ZLIB may be found at http://zlib.net/feldspar.html. Further information about GZIP may be found at https://www.gnu.org/software/gzip/. Although the example of FIG. 15 pertains to a compressed file, similar activities may be performed for compressed streams.

File 1510 is seen to include, for example, a header 1512, a payload 1514 of compressed data, and a footer 1516. Decompression may start at the beginning of the payload 1514 (point P0) and proceed in a forward direction. At point P1, decompression has advanced to a point where an initial decompressed region 1520*a* has been produced. Decompression of this initial region may proceed without a dictionary, with a default dictionary, or with a user-specified dictionary, for example. The decompressed data forms a dictionary 1530 for decompressing subsequent data of the file 1510. For example, the dictionary 1530 is merely the most recently decompressed data, with the compressed data that follows the dictionary 1530 including references back to byte ranges in the dictionary 1530. Such references may be provided as offsets (e.g., number of bytes backwards from a current position) and lengths, for example.

In an example, the dictionary 1530 is provided as a sliding window of decompressed data of determined length, such as 32 kB, for example. As decompression proceeds, the dictionary window 1530 advances, staying just behind the current byte position. For example, the dictionary 1530 appears at the end of the decompressed region 1520b, and later at the end of the decompressed region 1520c (bottom of FIG. 15).

Although the example shown in FIG. 15 is for a file 1510, similar principles apply for streams. Thus, embodiments are not limited to files.

Figure 16:
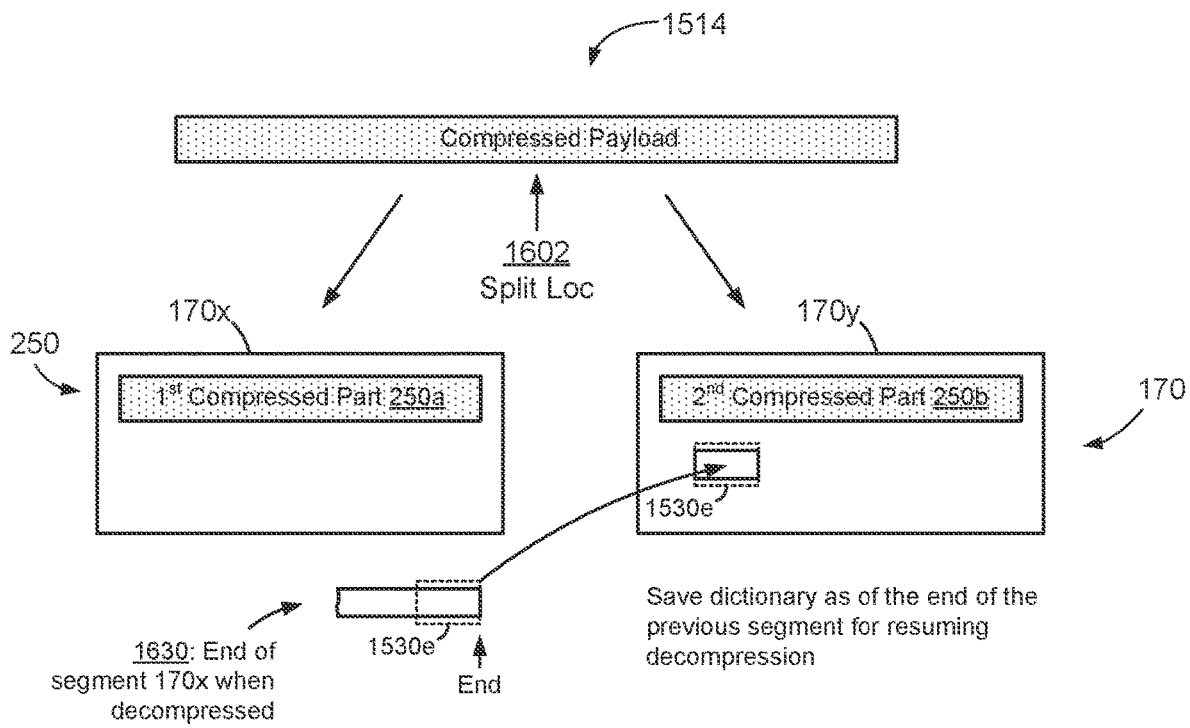
FIG. 16 is a block diagram showing an example arrangement for splitting a compressed payload between multiple portions.

FIG. 16 shows an example of splitting the compressed payload 1514 of FIG. 15 while preserving the ability to decompress the compressed data. Here, the compressed payload 1514 is split at location 1602 (e.g., a specified byte offset in the compressed data). A first portion 250a of the compressed payload goes to a first segment 170x, and a second portion 250b of the compressed data goes to a second segment 170y. The portions 250a and 250b and segments 170x and 170y may be examples of the portions 250 and segments 170 described in connection with Section I, e.g., as portions formed by the splitter 220 and segments formed by the transformer 230 (FIG. 2).

If the procedure for splitting the compressed payload were to stop here, then the second compressed portion 250b could not be decompressed independently of the first compressed portion 250a. This is because decompression of the second portion 250b relies upon having access to the dictionary 1530, e.g., the range of most recently decompressed data. Although conventional Deflate decompression works independently for the first portion 250a (e.g., because it utilizes a default dictionary, a user-selected dictionary, or no dictionary), it would not work independently for the second portion 250b, as the required dictionary 1530 would be missing.

To address this deficiency, embodiments herein capture the state of the dictionary 1530 as of the end of the first portion 250a and store that dictionary as metadata associated with the second portion 250b. We refer to this dictionary as reference 1530e to identify it as being from the end of the previous portion. The dictionary 1530e may be stored in association with the second portion 250b in a variety of ways. These may include, for example, storing the dictionary as a header of the segment 170y that contains the second compressed portion 250b, as a footer of the segment 170y, or as separate metadata, such as segment metadata 124 described in connection with FIG. 1. In some examples, additional decompression-state metadata may be stored along with the dictionary 1530e, such as flags and/or other settings. For example, the entire state of the Inflate algorithm may be stored.

One should appreciate that the split location 1602 may be anywhere along the length of the compressed payload 1514. Thus, capturing the dictionary 1530 at the split location 1602 may involve decompressing the payload 1514 from the beginning and pausing decompression once it has reached location 1602. At this point, the dictionary 1530 may be obtained simply as the current dictionary state (e.g., via a call into a library, such as ZLIB). Decompression of the compressed payload 1514 may then resume if necessary (e.g., if additional splitting is needed).

Preserving the dictionary 1530e in metadata of the second portion 250b enables the second portion 250b to be decompressed independently of the first portion 250a. This can be done by decompressing the first bytes of the second portion 250b using the dictionary 1530e and advancing the dictionary forward, e.g., in the manner described in FIG. 15, until the dictionary is formed entirely from decompressed data of the second portion 250b. Decompression can then proceed in the normal manner. One should appreciate that the dictionary 1530e may itself be stored in the second portion 250b in compressed form, e.g., as an independently compressed object, which would then be decompressed when decompression of the second portion 250b is desired. Compressed storage of the dictionary 1530e is not required, however.

Although the example of FIG. 16 shows only a single split that forms two portions 250, the compressed payload 1514 may be split into any desired number of portions. In such cases, each compressed portion except the first would include a respective dictionary 1530e (and any other desired decompression-state information) as of the end of the immediately preceding portion.

One should appreciate that the portions 250a and 250b store compressed data, which is preferably identical to the respective ranges of the compressed payload 1514. The act of splitting thus preferably preserves the original compressed data in every respect. Although decompression may be used to provide dictionaries 1530e (as well as for other purposes, discussed below), it is typically neither necessary nor desirable to store decompressed data of the entire payload 1514. Rather, decompressed data typically is not needed and can be obtained on demand whenever desired.

In some examples, splitting of the compressed payload 1514 may be based at least in part on information about corresponding uncompressed data. For example, it may be desirable for segments to store amounts of data that are similar when that data is decompressed, as doing so may help to balance computing resources when data is processed. Thus, splitting may be done in such a way as to form portions 250 that decompress to similar sizes of decompressed data. This may be the case even if it means that the parts themselves (of compressed data) are of significantly different sizes. Accordingly, when splitting compressed data into multiple portions, uncompressed versions of the portions of compressed data may be closer to one another in size than are the corresponding portions of compressed data, which may differ from one another to a greater degree.

Figure 17:
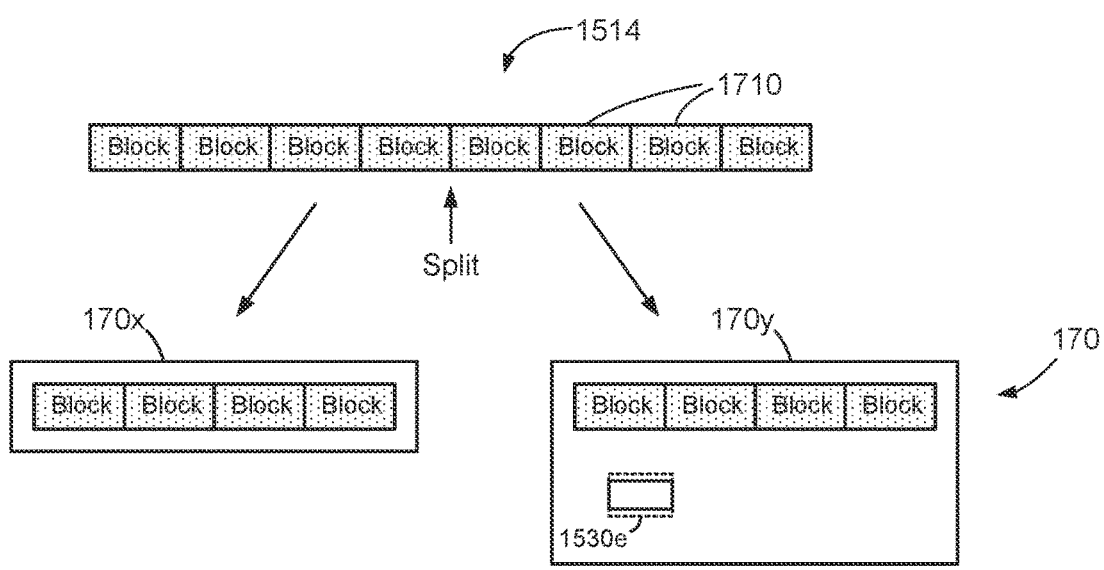
FIG. 17 is a block diagram showing an example arrangement for splitting a compressed payload between multiple portions, where the compressed payload is arranged in deflate blocks.

FIG. 17 shows an arrangement similar to FIG. 16, except that the payload 1514 in FIG. 17 is seen to be composed of multiple blocks 1710. Such blocks 1710 may be referred to herein as "deflate blocks," as they are deflated (compressed in size). Blocks 1710 may be uniform in size; although this is not required. Borders between blocks 1710 may be indicated in any suitable way.

In some examples, blocks 1710 may be kept together when splitting the payload 1514. Thus, splitting may occur on block boundaries (or "borders"). For example, once a desired split location is identified, e.g., based on compressed size and/or decompressed size, the actual split location may be moved forward or back, e.g., to the closest block border.

Figure 18:
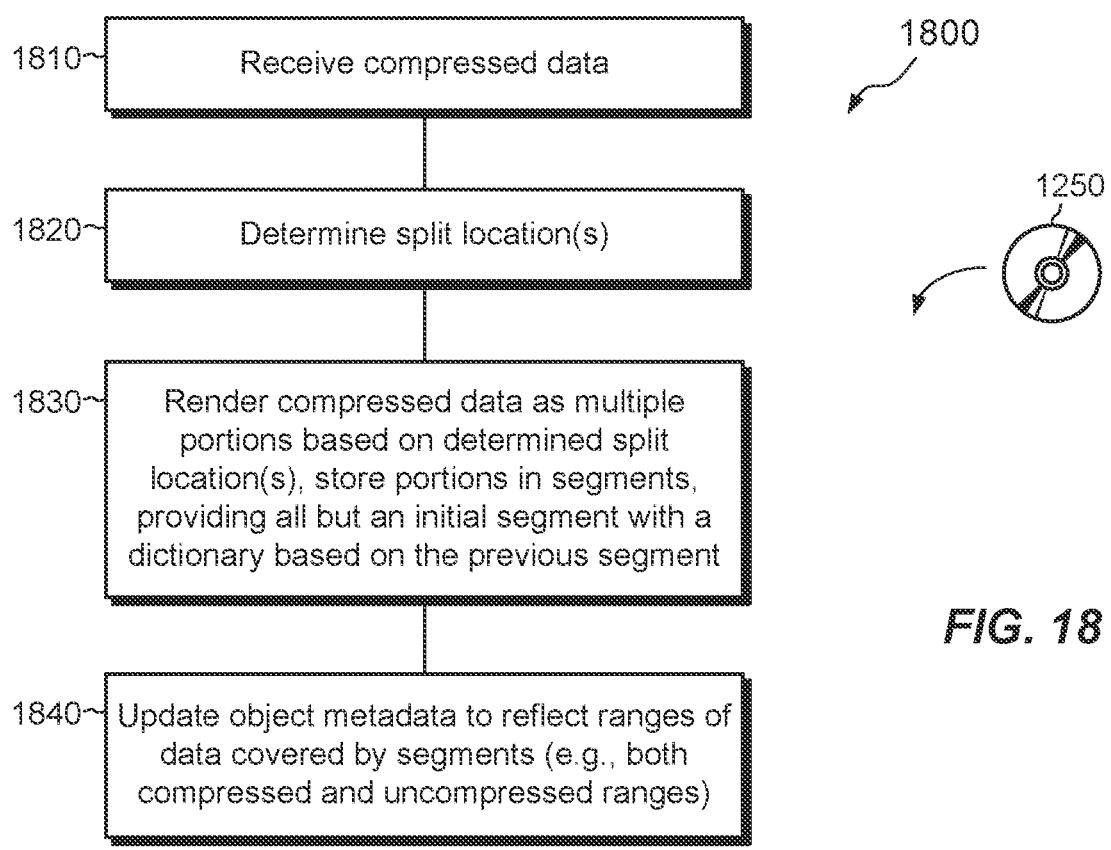
FIG. 18 is a flowchart showing an example method of splitting compressed data.

FIG. 18 shows an example method 1800 of splitting a compressed payload 1514 and summarizes some of the activities described above. The method 1800 may be performed, for example, by the gateway 110 described in connection with FIG. 2, which includes the type detector 210, splitter 220, and transformer 230.

At 1810, compressed data is received, e.g., in the form of a compressed file or stream. The file or stream includes a compressed payload 1514, which may be compressed using ZLIB's Deflate compression algorithm, for example.

At 1820, one or more split locations 1602 in the compressed payload 1514 are determined. Determinations of split locations 1602 may be based on any number of factors, which may include desired sizes of compressed portions 250 and/or desired sizes of uncompressed data of the compressed portions 250. When considering uncompressed sizes, method 1800 may compute uncompressed sizes based on actual decompression of portions of the payload 1514 (e.g., as performed when identifying dictionaries 1530 for splitting). Split locations 1602 may be determined with or without consideration of the nature or type of the data stored in the payload 1514.

At 1830, the compressed data of payload 1514 is rendered as multiple portions 250 based on the determined split location(s) 1602. For example, the splitter 220 separates the compressed payload 1514 into portions 250, which the transformer 230 places into respective segments 170. To enable independent decompression, dictionaries 1530e are provided with each portion 250, except the first portion, e.g., as metadata stored with the respective segments 170. The dictionary 1530e stored with a compressed portion 250 reflects the state of decompression as of the end of the immediately previous portion.

At 1840, the method 1800 further includes updating object metadata, such as metadata 112 of FIG. 1, to reflect ranges of data covered in the segments 170 that store the compressed portions 250. As splitting the payload 1514 involves performing a running decompression of its data, object metadata 112 can reflect ranges of uncompressed data as well as ranges of compressed data. The object metadata 112 can also reflect ranges of rows or records, total numbers of rows or records, total numbers of compressed bytes, total numbers of uncompressed bytes, and any other useful information. In some examples, the object metadata 112 identifies the nature or type of data, such as CSV data, JSON data, or the like, which may be identified by the type detector 210 and/or splitter 220, for example.

Figure 19:
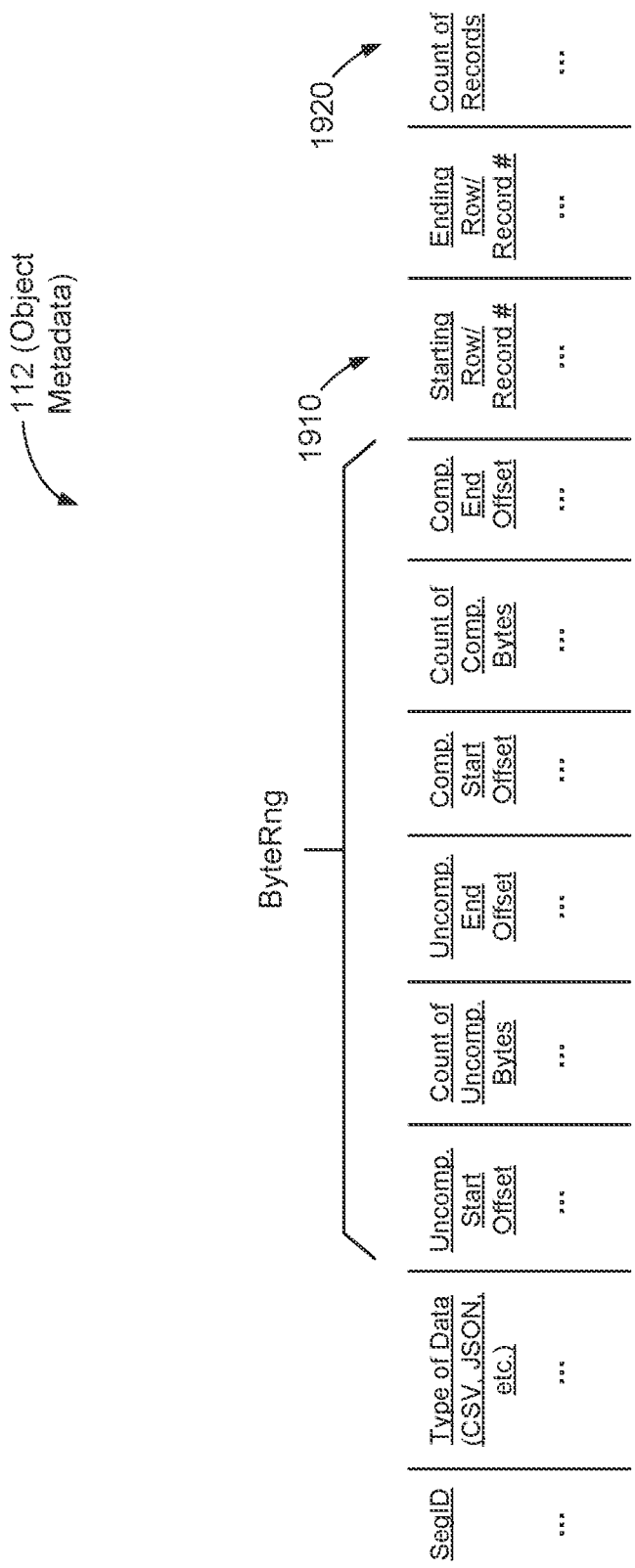
FIG. 19 is a table showing an example arrangement of object metadata.

FIG. 19 shows an example of such object metadata 112 in additional detail. As shown, object metadata 112 may associate segments 170 (designated as SegID's) with compressed starting offsets, ending offsets, and lengths, as well as with uncompressed starting offsets, ending offsets, and lengths. The units for offsets and lengths may be bytes, for example. In this manner, object metadata 112 may support random access to any byte range, whether that range is expressed as a range of compressed data or as a range of uncompressed data. Note that some embodiments may avoid storing both ending offsets and lengths, as either of them implies the other when the starting offset is known.

In an example, a client may request part of a file as a range of compressed bytes. By querying the object metadata 112, the client may identify the segment 170 that stores the requested data, e.g., as the SegID associated with compressed start and end offsets that encompass the requested range. The requested bytes may then be accessed from the identified segment 170 by counting forward by bytes to locate the beginning and end of the requested range.

If the requested range of compressed bytes extends across multiple segments (e.g., segments having contiguous SegIDs), such segments may be identified from the object metadata 112, again, based on starting and ending offsets as listed. The cluster may identify a first segment and count forward by bytes to locate a first byte of the requested range, and then continue to count forward by bytes, crossing into one or more subsequent segments, until it encounters the last byte of the requested range. The cluster may then return the compressed data between the first byte and the last byte as a response to the request.

Alternatively, a client may request part of a file as a range of uncompressed bytes. For example, the client may query the object metadata 112 to identify the segment 170 that stores data of the requested range of uncompressed bytes, e.g., as the SegID associated with uncompressed start and end offsets that encompass the requested range. The requested data may then be accessed from the identified segment 170 by decompressing, in whole or in part, the portion 250 stored in the identified segment, and counting forward within the uncompressed data by bytes to locate the beginning and end of the requested range. The cluster may then return the uncompressed bytes between the beginning and end as a response to the request. Notably, it would not be necessary to decompress data stored in other segments in order to achieve this. Rather, the indicated segment 170 may be decompressed independently.

If a requested range of uncompressed bytes extends across multiple segments, those segments may be identified from the object metadata 112 and decompressed in order. For example, the cluster decompresses a first identified segment and counts forward in bytes to locate a first byte of the requested range. The cluster then continues to count forward by uncompressed bytes, to one or more subsequent segments, which are decompressed in turn, until it encounters the last byte of the requested range. The cluster then returns the uncompressed data between the first byte and the last byte as a query response.

In some examples, object metadata 112 may further store a starting row or record number 1910 and a count 1920 of rows or records in connection with certain segments 170. Rows or records may pertain to CSV rows (lines), JSON records, Parquet row groups, or the like, for example. The rows or records may be identified based on row or record number (first row, second row, hundredth row, etc.). For example, when decompressing the payload 1514, the splitter 220 may keep track of rows or records in the decompressed data such that it identifies the number of the first row or record and the count of such rows or records in each portion 250. The splitter 220 may also keep track of the ending row or record number in some examples.

When operating the splitter 220 on CSV data, it is not necessary to determine whether the initial line is a header line. Thus, for example, starting row/record 1910 and count 1920 need not distinguish between header lines and content lines; rather, header lines and content lines may all be counted the same way. Later requests for reading CSV data may specify lines in absolute terms (without regard to headers), or based on line numbers following a header. For cases where a header line is provided, a content line may be computed simply as one less than the absolute line number. This adjustment can be done easily when data is requested and need not be done at the time of splitting and storage. That said, nothing herein precludes the object metadata 112 from storing an indication of whether the data includes a header line. One should appreciate that the object metadata 112 may store starting numbers 1910 and counts 1920 of rows or records regardless of whether associated data is stored in compressed form or in uncompressed form.

The storage of starting rows or record numbers 1910 and counts 1920 greatly facilitates lookups. Consider a case where a client requests a CSV line "1000" of a specified data object. In response to the request, the storage cluster 130 may check the object metadata 112 to identify the particular segment that stores CSV line 1000, e.g., based on metadata 910 and 912. The cluster may then access the identified segment, decompress its data (in whole or in part), and count forward from the starting row/record 1910 to line 1000. The cluster may then extract the line 1000 of CSV data and return it to the client. Similar acts may be performed for ranges of rows, including ranges that span multiple segments. Where ranges or rows of records extend across multiple segments, the cluster may identify each such segment from the object metadata 112, access each segment in turn, decompress its data, and extract the specified lines.

Sometimes, a queried byte range of uncompressed data may start or end in the middle of a row or record, such that only a portion of the row or record is included in the requested range. For such cases, a convention may be adopted either to include or to exclude the entire row or record. For example, the convention may specify that an entire row or record be returned whenever any bytes of that row or record are requested. In order to satisfy this convention, it may be necessary to perform decompression to locate the boundaries of that row or record, even though the data to be returned will be compressed.

Figure 20:
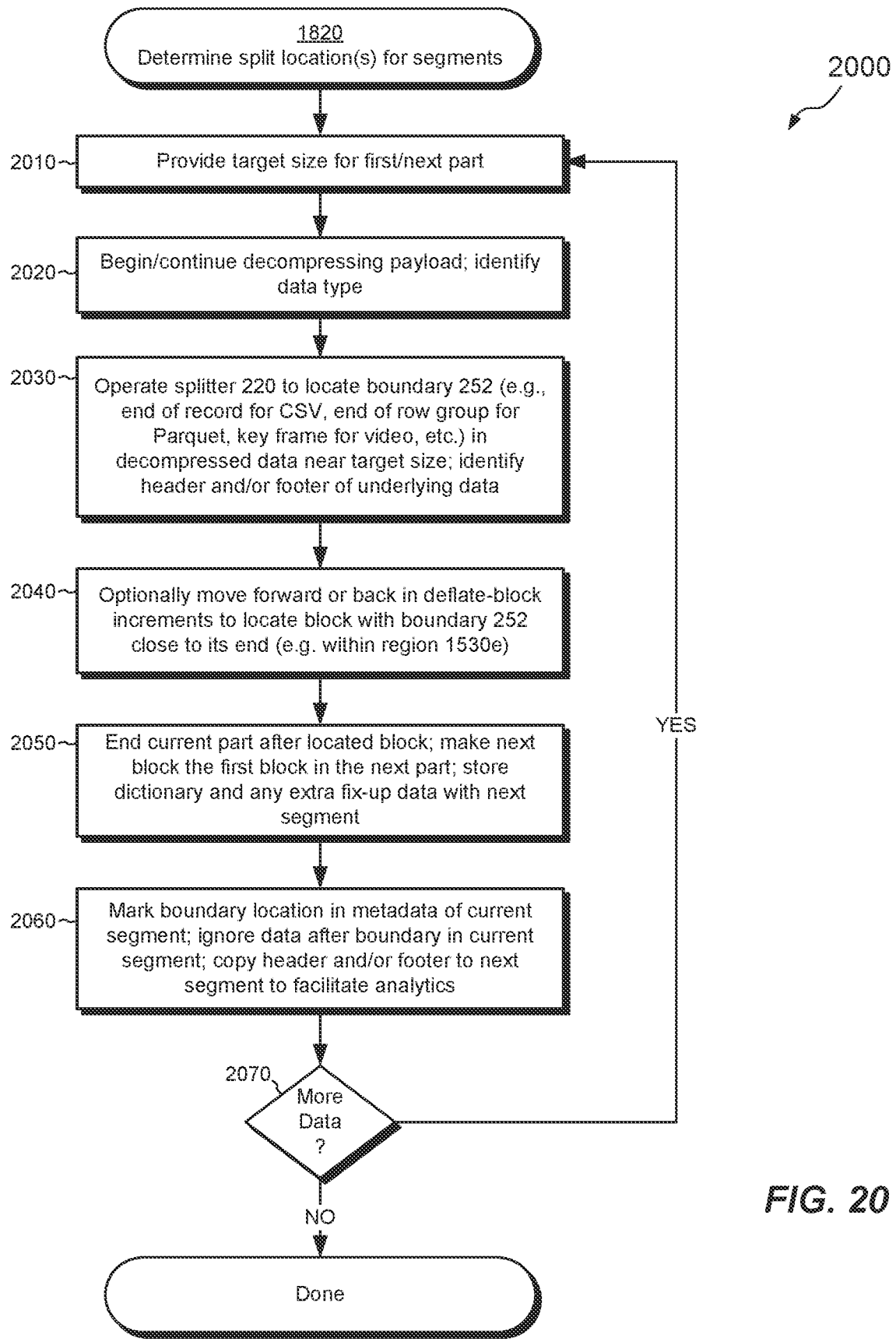
FIG. 20 is a flowchart showing an example method of determining split locations in compressed data based on natural boundaries in the data.

FIG. 20 shows an example method 2000 of splitting data in a content-sensitive manner. Content-sensitive splitting may be useful when attempting to place individually processable units of data in respective segments 170, such that data stored in segments may be processed independently of other segments. Method 2000 may be performed, for example, by the splitter 220 described in connection with FIG. 2.

In this example, a compressed payload 1514 is split in a manner that keeps related data together and thereby facilitates independent processing of related data by nodes 120 of the storage cluster 130. Method 2000 may proceed as follows.

At 2010, a target size may be provided for a first portion 250a. As described above, the target size may be based on a size of compressed data and/or on a size of corresponding uncompressed data. The target size implies a target split location in the payload 1514, e.g., as the starting offset of the payload plus the target size. The target size may be provided once for all portions 250 or separately for different portions 250.

At 2020, decompression of the payload 1514 begins. Initial decompression does not require a dictionary 1530e but rather may use a default dictionary, a user-selected dictionary, or no dictionary. As decompression begins, type detector 210 and/or splitter 220 may attempt to identify the type of data provided, e.g., whether the payload contains CSV data, Parquet data, video data, or the like, e.g., in the manner described in connection with FIG. 2.

At 2030, splitter 220 locates a boundary 252 in the decompressed data near the specified target size. Examples of a boundary 252 include an end of a CSV record, an end of a JSON record, the end of a Parquet row group, a key frame of video data, or the like. The splitter 220 may also attempt to identify descriptive information, such as CSV headers, Parquet headers and footers, and the like, in the uncompressed data. Such descriptive data may be propagated to multiple segments to facilitate independent processing of underlying data.

At 2040, the splitter 220 optionally moves forward or back in deflate-block increments to find a more suitable split location 1602. For example, it is generally most efficient if a natural boundary 252 can be found near the end of a deflate block 1710, i.e., within the range that will become the dictionary 1530e of the next portion 250b after the split. If no natural boundary 252 can be found within that range, the splitter may try the next deflate block or the previous deflate block (or multiple blocks in each direction), attempting to find a deflate block having a boundary 252 near its end. If no such deflate block having a boundary 252 near its end can be found within a reasonable distance of the target split location, the splitter may select a deflate block, from among the blocks near the target split location, as the block that has a boundary 252 closest to its end.

At 2050, the splitter 220 establishes an end of the current portion 250a as the end of the selected deflate block. The splitter 220 also establishes the beginning of the next portion 250b as the beginning of the deflate block 1710 that immediately follows the selected deflate block. The splitter 220 further identifies the dictionary 1530e from the end of the selected deflate block. The identified dictionary 1530e will be stored in the metadata of the segment 170 that contains the next portion 250b.

Ideally, the located boundary 252 and the data that follows it within the selected block are all contained within the dictionary 1530e, such that the dictionary 1530e contains all of the needed "fix-up" data, i.e., data of the current portion 250a, appearing after the boundary 252, which is needed for independently processing the data of the next portion 250b. For example, without the fix-up data, the data of the next portion would not be complete and could not be processed independently (although it could be decompressed independently). If the boundary 252 is not found within the dictionary 1530e of the selected deflate block but rather appears earlier in the selected deflate block, then additional fix-up data may be identified, i.e., as data appearing after the boundary 252 but before the start of the dictionary 1530e. Such additional fix-up data may be stored with the next portion/segment, e.g., as additional metadata, thus ensuring that the data of the next segment is able to be processed independently of the data of the current segment, or of any other segments.

At 2060, the location of the boundary 252 is marked in the metadata of the current portion 250a. Such marking may be useful later when independently processing uncompressed data of the current portion 250a, as it enables any data after the boundary 252 to be ignored for such processing (as it may be processed with the next portion 250b). In addition, in some examples any descriptive data found during step 2030 (e.g., CSV header, Parquet header or footer, etc.) may be copied to the metadata of the next segment 170, where it may facilitate independent processing of the next portion.

At 2070, the splitter 220 determines whether there is more data in the payload 1514 to be split. If so, operation returns to 2010, whereupon a new target size and target split location are determined for the next portion 250b, and the above-described acts 2010-2060 are repeated. The method 2000 continues in this fashion until no further splits are needed, at which point the method 2000 completes. One should appreciate that the method 2000 ensures not only that data of respective segments can be decompressed independently, but also that such data can be processed independently after it is decompressed.

Figure 21:
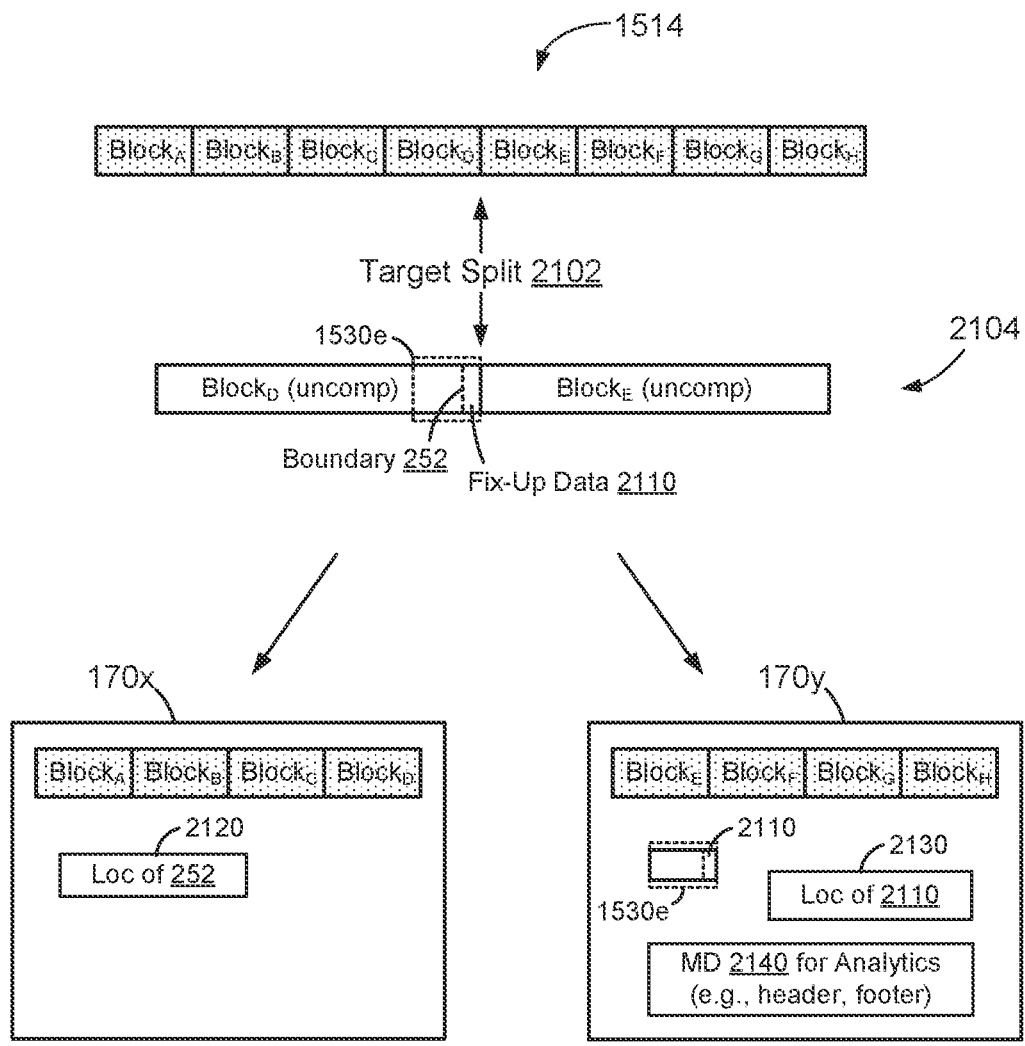
FIG. 21 is a block diagram showing an example arrangement for splitting a compressed payload between multiple portions, in cases where a natural boundary in the data is found within a decompression dictionary.

FIG. 21 shows an example arrangement in which a natural boundary 252 is found within a dictionary 1530e of a deflate block 1710 near a split location. Here, split location 2102 coincides with a border between deflate blocks D and E of payload 1514, which includes deflate blocks A through H. As seen in the decompressed (inflated) blocks 2104, block D includes a boundary 252 that falls within the dictionary 1530*e* at the end of block D. Fix-up data 2110 may be defined as the data in block D that appears after the boundary 252. When the payload 1514 is split, deflate blocks A-D are assigned to segment 170*x* and deflate blocks E-H are assigned to segment 170*y*.

To facilitate independent processing, segment 170*x* stores a location 2120 of the boundary 252. Such location 2120 enables later processing of the data in segment 170*x* to ignore any data that appears after the boundary 252. Also, segment 170*y* stores metadata that includes the fix-up data 2110, which in this case is contained entirely within the dictionary 1530*e*. The metadata of segment 170*y* also includes the location 2130 of the fix-up data 2110 (e.g., that of the boundary 252 within the stored dictionary 1530*e*). Such metadata may also include any descriptive data 2140 (e.g., CSV headers, Parquet headers and footers, etc.), which may be useful for independently processing the data in segment 170*y*.

Figure 22:
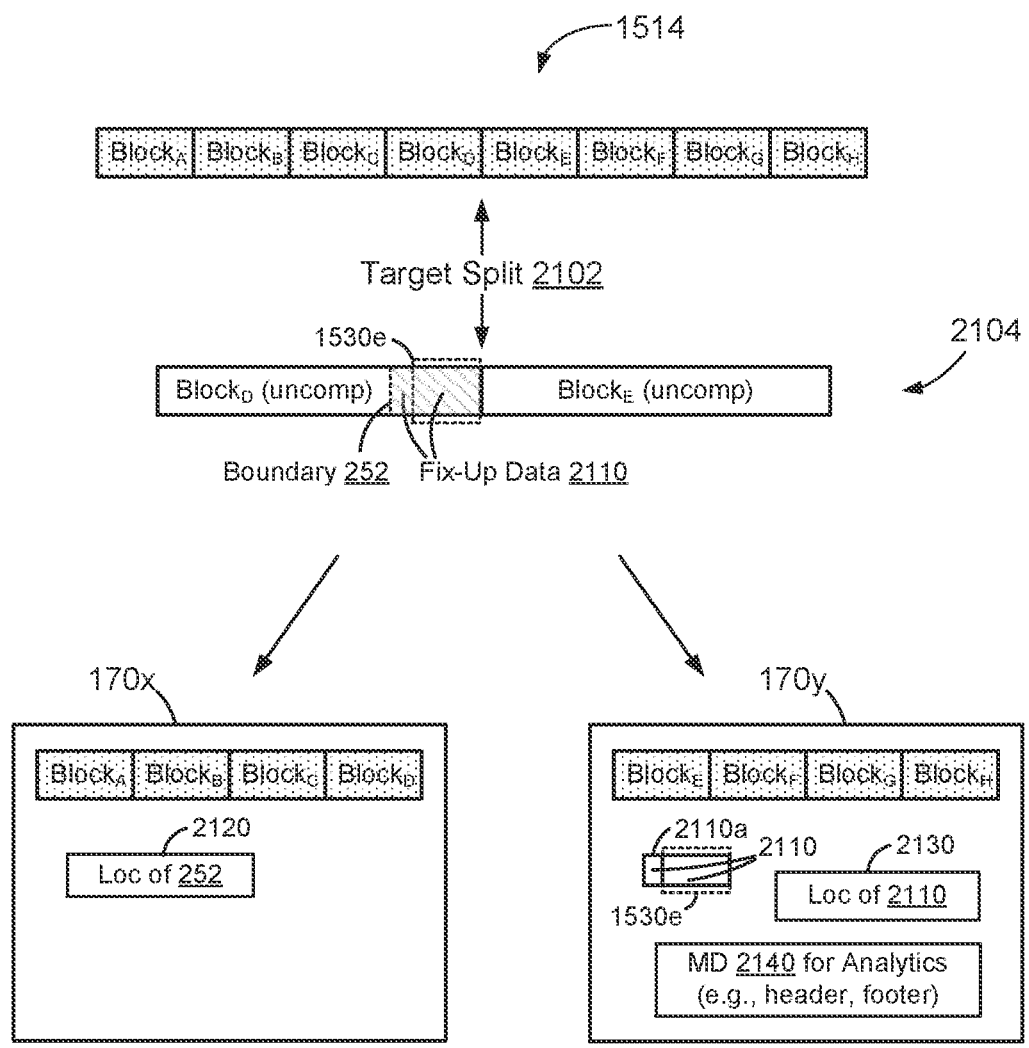
FIG. 22 is a block diagram showing an example arrangement for splitting a compressed payload between multiple portions, in cases where a natural boundary in the data is found prior to a decompression dictionary.

FIG. 22 is similar to FIG. 21, except that here the natural boundary 252 does not fall within the range of the dictionary 1530*e*, but rather appears prior to the dictionary 1530*e*. In this case, fix-up data 2110 includes all of the data in the dictionary 1530*e*, as well as additional data 2110*a*. The additional fix-up data 2110*a* may be stored with the metadata of segment 170*y*, e.g., in a header, footer, or otherwise, and may be stored in compressed form or in uncompressed form.

Figure 23:
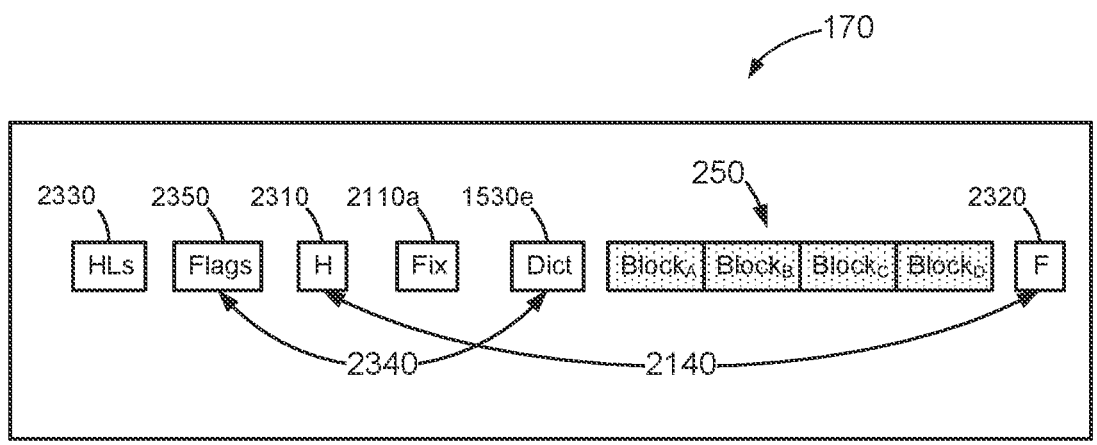
FIG. 23 is a block diagram showing an example layout of an example segment.

FIG. 23 shows additional example aspects of splitting and storing metadata. As shown, a segment 170 may include, in addition to original portion 250 of deflate data, segment header data 2310 and segment footer data 2320, which may provide the descriptive data 2140 described above. The segment 170 may further include header lengths 2330, additional fix-up data 2110*a*, and a saved decompression state 2340, which may include the dictionary 1530*e* as well as additional flags and/or settings 2350. In some examples, boundaries 2120 and 2130 may be provided within header lengths 2330, with the boundary 2120 indicating where processing of uncompressed data of the current segment can stop, and with the boundary 2130 indicating where the fix-up data for processing the current segment begins.

Figure 24:
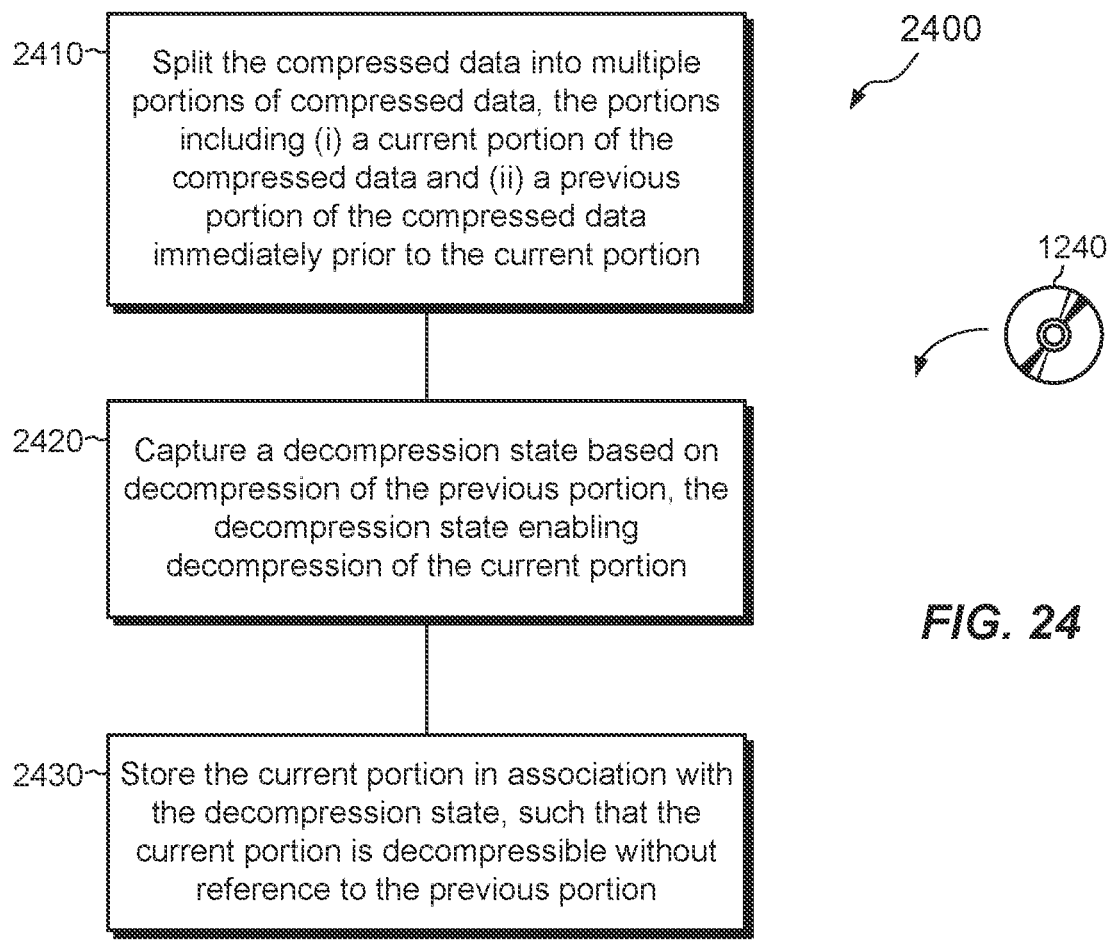
FIG. 24 is a flowchart showing an example method of managing compressed data.

FIG. 24 shows an example method 2400 that may be practiced in certain embodiments and provides a summary of some of the features described above. The method 2400 may be performed, for example, by the gateway 110 described in connection with FIG. 2.

At 2410, compressed data 1514 is split into multiple portions 250 of compressed data. The portions 250 include (i) a current portion 250*b* of the compressed data and (ii) a previous portion 250*a* of the compressed data immediately prior to the current portion 250*b*.

At 2420, a decompression state 2340 (e.g., dictionary 1530*e* and flags/settings 2350) is captured based on decompression of the previous portion 250*a*. The decompression state 2340 enables decompression of the current portion 250*b*.

At 2430, the current portion 250*b* is stored in association with the decompression state 2340, such that the current portion is decompressible without reference to the previous portion 250*a*.

An improved technique has been described of partitioning compressed data 1514. The technique includes splitting the compressed data 1514 into multiple portions 250. The technique further includes storing a decompression state 2340 in association with a current portion 250*b*, wherein the decompression state 2340 is based on data of a previous portion 250*a* and enables decompression of the current portion 250*b* independently of other portions.

Having described certain embodiments, numerous alternative embodiments or variations can be made. For example, although embodiments have been described in which each segment 170 includes a respective portion 250 of compressed/deflate data and is stored on a respective node of the storage cluster 130, this is merely an example. Alternatively, multiple segments may be stored together on a particular node of the storage cluster 130. Such segments may be stored in the form already described above, but they may alternatively take a different form. For instance, multiple segments 170 on a single node may be combined to form a single shard of data. In such cases, headers and footers of the constituent segments 170 of the shard may be consolidated into a single header or footer (to avoid excessive jumping within memory), and the portions 250 of compressed/deflate data may be aggregated in order, as a continuous compressed extent. In such cases, segment footer data 2320 may appear before aggregated portions 250, e.g., immediately following additional fix-up data 2110*a*, thus allowing construction of complete segment without having to read to the end of the object. Storing portions 250 in this matter allows for independent control over the sizes of individual portions and the amounts of data stored per node. When storing data in shards, erasure coding, as described in connection with FIGS. 7-9 of Section I, may be performed on respective shards rather than on respective segments 170.

Further, although examples have been described in which portions 250 of compressed data are defined based at least in part on boundaries 252 between individual processable units of data, this is merely an example. Some forms of data, such as biological data, experimental data, and the like, may contain no clear boundaries 252 between processable units. In such cases, it may be desirable to store overlapping regions of data. The overlapping regions may be stored as compressed data or as uncompressed data. If stored as compressed data, a next portion of compressed data may begin at some determined offset prior to the end of a previous portion, such that both consecutive portions include the same overlapping region. Alternatively, the regions 250 may remain distinct and the compressed regions of overlap may be stored as metadata, e.g., in a segment header or footer. If stored in uncompressed form, the regions of overlap may be stored as metadata (e.g., in a segment header or footer). If the length of the desired overlap region is less than the length of the dictionary 1530*e*, then no additional data storage may be needed, as the dictionary 1530*e* will already include the desired overlap region.

Further, although features have been shown and described with reference to particular embodiments hereof, such features may be included and hereby are included in any of the disclosed embodiments and their variants. Thus, it is understood that features disclosed in connection with any embodiment are included in any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like (shown by way of example as medium 1250 in FIGS. 12, 18, and 24). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Also, a "set of" elements can describe fewer than all elements present. Thus, there may be additional elements of the same kind that are not part of the set. Further, ordinal expressions, such as "first," "second," "third," and so on, may be used as adjectives herein for identification purposes. Unless specifically indicated, these ordinal expressions are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Also, and unless specifically stated to the contrary, "based on" is intended to be nonexclusive. Thus, "based on" should not be interpreted as meaning "based exclusively on" but rather "based at least in part on" unless specifically indicated otherwise. Although certain embodiments are disclosed herein, it is understood that these are provided by way of example only and should not be construed as limiting.

Those skilled in the art will therefore understand that various changes in form and detail may be made to the embodiments disclosed herein without departing from the scope of the following claims.

What is claimed is:

1. A method of managing compressed data, comprising:
    splitting, in response to a running decompression, the compressed data into multiple portions of compressed data, the portions including (i) a current portion of the compressed data and (ii) a previous portion of the compressed data immediately prior to the current portion;
    capturing a decompression state based on decompression of the previous portion, the decompression state enabling decompression of the current portion; and
    storing the current portion in association with the decompression state, wherein the current portion is decompressible without reference to the previous portion,
    wherein the decompression state stored in association with the current portion includes a dictionary formed from a range of decompressed data of the previous portion.

2. The method of claim 1, wherein the range of decompressed data has a length and extends to an end of the previous portion.

3. The method of claim 1, further comprising:
    storing the portions of compressed data in respective segments on storage nodes of a storage cluster; and
    tracking, in metadata, locations of the respective segments on the storage nodes.

4. The method of claim 3, wherein storing the portions of compressed data in the respective segments includes storing the current portion in a current segment on a particular node of the storage cluster, and wherein storing the current portion in association with the decompression state includes storing the decompression state on the particular node.

5. The method of claim 4, wherein storing the decompression state on the particular node includes storing the decompression state in a header and/or a footer of the current segment.

6. The method of claim 3, wherein the metadata associates segments with respective byte ranges of compressed data stored in the respective segments, and wherein the method further comprises:
    receiving a specified byte range of the compressed data;
    identifying, from the metadata, a target segment that stores at least a portion of the specified byte range of the compressed data; and
    accessing the target segment to retrieve the specified byte range or the portion of the specified byte range.

7. The method of claim 3, wherein the metadata associates segments with respective byte ranges of uncompressed data, and wherein the method further comprises:
    receiving a specified byte range of uncompressed data;
    identifying, from the metadata, a target segment that stores compressed data which, when decompressed, provides at least a portion of the specified byte range of uncompressed data; and
    accessing the target segment to retrieve the specified byte range of uncompressed data or the portion of the specified byte range.

8. The method of claim 3, wherein the metadata associates segments with respective ranges of rows or records of uncompressed data, and wherein the method further comprises:
    receiving a specified range of rows or records of the uncompressed data;
    identifying, from the metadata, a target segment that stores compressed data which, when decompressed, provides at least part of the specified range of rows or records; and
    accessing the target segment to retrieve the specified range of rows or records or the part of the specified range of rows or records.

9. The method of claim 1, wherein, when splitting the compressed data into multiple portions, uncompressed versions of the portions of compressed data are closer to one another in size than are the portions of compressed data.

10. The method of claim 1, wherein splitting the compressed data includes:
    identifying a target split location in the compressed data; and
    splitting the compressed data at a selected split location different from the target split location based on uncompressed contents of the compressed data, the selected split location separating the current portion from a next portion that immediately follows the current portion.

11. The method of claim 10, wherein splitting the compressed data at the selected split location includes:
    decompressing a range of compressed data in the current portion;
    identifying a boundary within the decompressed data of the range, the boundary defining an end of an individually processable unit of decompressed data; and
    assigning the selected split location as a location that follows the boundary.

12. The method of claim 11, wherein the individually processable unit of decompressed data includes any one of (i) a row of CSV (comma-separated values) data, (ii) a JSON (JavaScript Object Notation) record, or (iii) any other row of row-delimited data or record of record-delimited data.

13. The method of claim 11,
wherein the compressed data is arranged in deflate blocks,
wherein the boundary is contained within a particular deflate block of the compressed data, the particular deflate block having an end, and
wherein assigning the selected split location as the location that follows the boundary includes defining the selected split location as the end of the particular deflate block.

14. The method of claim 11, further comprising:
obtaining a set of fix-up data as data located between the boundary and the selected split location; and
storing the set of fix-up data in association with the next portion.

15. The method of claim 14, further comprising storing an indicator of the boundary in association with the current portion, the indicator identifying a location beyond which processing of uncompressed data derived from the compressed data of the current portion is ignored.

16. The method of claim 14, wherein the set of fix-up data is contained entirely within a dictionary to be stored in association with the next portion, and wherein the method further comprises storing, in association with the next portion, an indicator of the boundary within the dictionary.

17. The method of claim 15, wherein the set of fix-up data is not contained entirely within a dictionary to be stored in association with the next portion, and wherein storing the set of fix-up data includes storing, in association with the next portion, additional fix-up data that is not contained within the dictionary.

18. The method of claim 14, further comprising identifying descriptive content in the decompressed data of a current portion and storing the descriptive content in association with the next portion to facilitate independent processing of data in the next portion.

19. The method of claim 1, wherein splitting the compressed data into multiple portions of compressed data includes providing an area of overlap between two consecutive portions, and wherein the two consecutive portions both include the area of overlap.

20. A computerized apparatus, comprising control circuitry that includes a set of processors coupled to memory, the control circuitry constructed and arranged to:
split, in response to a running decompression, the compressed data into multiple portions of compressed data, the portions including (i) a current portion of the compressed data and (ii) a previous portion of the compressed data immediately prior to the current portion;
capture a decompression state based on decompression of the previous portion, the decompression state enabling decompression of the current portion; and
store the current portion in association with the decompression state, wherein the current portion is decompressible without reference to the previous portion,
wherein the decompression state stored in association with the current portion includes a dictionary formed from a range of decompressed data of the previous portion.

21. A computer program product including a set of non-transitory, computer-readable media having instructions which, when executed by control circuitry of a computerized apparatus, cause the computerized apparatus to perform a method of managing compressed data, the method comprising:
splitting, in response to a running decompression, the compressed data into multiple portions of compressed data, the portions including (i) a current portion of the compressed data and (ii) a previous portion of the compressed data immediately prior to the current portion;
capturing a decompression state based on decompression of the previous portion, the decompression state enabling decompression of the current portion; and
storing the current portion in association with the decompression state, wherein the current portion is decompressible without reference to the previous portion,
wherein the decompression state stored in association with the current portion includes a dictionary formed from a range of decompressed data of the previous portion.

22. The method of claim 1, wherein the compressed data is compressed without identifying the current portion or the previous portion of the compressed data.

* * * * *